(12) United States Patent
Choi et al.

(10) Patent No.: US 12,155,830 B2
(45) Date of Patent: *Nov. 26, 2024

(54) RESIDUAL CODING METHOD AND DEVICE FOR SAME

(71) Applicant: LG ELECTRONICS INC., Seoul (KR)

(72) Inventors: Jungah Choi, Seoul (KR); Sunmi Yoo, Seoul (KR); Jin Heo, Seoul (KR); Seunghwan Kim, Seoul (KR); Jangwon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/201,700

(22) Filed: May 24, 2023

(65) Prior Publication Data

US 2023/0319278 A1    Oct. 5, 2023

Related U.S. Application Data

(63) Continuation of application No. 17/207,162, filed on Mar. 19, 2021, now Pat. No. 11,700,372, which is a
(Continued)

(51) Int. Cl.
*H04N 19/136*        (2014.01)
*H04N 19/122*        (2014.01)
(Continued)

(52) U.S. Cl.
CPC ......... *H04N 19/122* (2014.11); *H04N 19/136* (2014.11); *H04N 19/176* (2014.11); *H04N 19/196* (2014.11)

(58) Field of Classification Search
CPC .. H04N 19/122; H04N 19/136; H04N 19/176; H04N 19/196; H04N 19/13;
(Continued)

(56) References Cited

U.S. PATENT DOCUMENTS 10,992,935 B2 *   4/2021   Choi ................ H04N 19/122
11,700,372 B2 *   7/2023   Choi ................ H04N 19/13
                                                         375/240.02
(Continued)

FOREIGN PATENT DOCUMENTS

JP     2022501896 A    1/2022
WO    2020060328 A1    3/2020

*Primary Examiner* — Tat C Chio
(74) *Attorney, Agent, or Firm* — Bryan Cave Leighton Paisner LLP

(57) ABSTRACT

A method for decoding a picture performed by a decoding apparatus according to the present disclosure includes receiving a bitstream including residual information, deriving a quantized transform coefficient for a current block based on the residual information included in the bitstream, deriving a transform coefficient from the quantized transform coefficient based on a dequantization process, deriving a residual sample for the current block by applying an inverse transform to the derived transform coefficient, and generating a reconstructed picture based on the residual sample for the current block.

11 Claims, 22 Drawing Sheets

Related U.S. Application Data continuation of application No. 16/856,898, filed on Apr. 23, 2020, now Pat. No. 10,992,935, which is a continuation of application No. PCT/KR2019/011195, filed on Aug. 30, 2019.

(60) Provisional application No. 62/735,211, filed on Sep. 24, 2018, provisional application No. 62/729,979, filed on Sep. 11, 2018.

(51) Int. Cl.
*H04N 19/176* (2014.01)
*H04N 19/196* (2014.01)

(58) Field of Classification Search
CPC ...... H04N 19/91; H04N 19/70; H04N 19/105; H04N 19/124; H04N 19/132; H04N 19/157; H04N 19/18; H03M 7/4075
See application file for complete search history.

(56) References Cited

U.S. PATENT DOCUMENTS

2017/0064336 A1\* 3/2017 Zhang .................. H04N 19/593
2020/0077117 A1\* 3/2020 Karczewicz ........... H04N 19/18

\* cited by examiner

RESIDUAL CODING METHOD AND DEVICE FOR SAME

CROSS-REFERENCE TO RELATED APPLICATIONS

This application is a continuation of U.S. patent application Ser. No. 17/207,162, filed Mar. 19, 2021, which is a continuation of U.S. application Ser. No. 16/856,898, filed Apr. 23, 2020, which is a continuation of International Application PCT/KR2019/011195, with an international filing date of Aug. 30, 2019, which claims the benefit of U.S. Provisional Application Nos. 62/729,979 filed on Sep. 11, 2018, and 62/735,211 filed on Sep. 24, 2018, the contents of which are all hereby incorporated by reference herein in their entirety.

BACKGROUND OF THE DISCLOSURE

Field of the Disclosure

The present disclosure relates to an image coding technology, and more particularly, to a residual coding method in an image coding system and a device thereof.

Related Art

Recently, the demand for high resolution, high quality image/video such as 4K or 8K Ultra High Definition (UHD) image/video is increasing in various fields. As the image/video resolution or quality becomes higher, relatively more amount of information or bits are transmitted than for conventional image/video data. Therefore, if image/video data are transmitted via a medium such as an existing wired/wireless broadband line or stored in a legacy storage medium, costs for transmission and storage are readily increased.

Moreover, interests and demand are growing for virtual reality (VR) and artificial reality (AR) contents, and immersive media such as hologram; and broadcasting of images/videos exhibiting image/video characteristics different from those of an actual image/video, such as game images/videos, are also growing.

Therefore, a highly efficient image/video compaction technique is required to effectively compress and transmit, store, or play high resolution, high quality images/videos showing various characteristics as described above.

SUMMARY

An object of the present disclosure is to provide a method and a device for enhancing image coding efficiency.

Another object of the present disclosure is to provide a method and a device for enhancing the efficiency of residual coding.

Still another object of the present disclosure is to provide a method and a device for enhancing residual coding efficiency by performing a binarization process on residual information based on a rice parameter.

Yet another object of the present disclosure is to provide a method and a device for performing residual coding by setting the maximum value of the rice parameter as 3.

Still yet another object of the present disclosure is to provide a method and a device for performing an initialization process to derive at least one rice parameter for a sub-block included in a current block.

An embodiment of the present disclosure provides a method for decoding an image performed by a decoding apparatus. The method includes receiving a bitstream including residual information, deriving a quantized transform coefficient for a current block based on the residual information included in the bitstream, deriving a transform coefficient from the quantized transform coefficient based on a dequantization process, deriving a residual sample for the current block by applying an inverse transform to the derived transform coefficient, and generating a reconstructed picture based on the residual sample for the current block, and the residual information includes transform coefficient level information, the deriving of the quantized transform coefficient includes performing a binarization process for the transform coefficient level information based on a rice parameter, deriving a value of the transform coefficient level information based on the result of the binarization process, and deriving the quantized transform coefficient based on the value of the transform coefficient level information, and the maximum value of the rice parameter is 3.

Another embodiment of the present disclosure provides a decoding apparatus for performing image decoding. The decoding apparatus includes an entropy decoder which receives a bitstream including residual information, and derives a quantized transform coefficient for a current block based on the residual information included in the bitstream, a dequantizer which derives a transform coefficient from the quantized transform coefficient based on a dequantization process, an inverse transformer which derives a residual sample for the current block by applying an inverse transform to the derived transform coefficient, and an adder which generates a reconstructed picture based on the residual sample for the current block, and the residual information includes transform coefficient level information, the entropy decoder performs a binarization process for the transform coefficient level information based on a rice parameter, derives a value of the transform coefficient level information based on the result of the binarization process, and derives the quantized transform coefficient based on the value of the transform coefficient level information, and the maximum value of the rice parameter is 3.

Still another embodiment of the present disclosure provides a method for encoding an image performed by an encoding apparatus. The method includes deriving a residual sample for a current block, deriving a transform coefficient by transforming the residual sample for the current block, deriving a quantized transform coefficient from the transform coefficient based on a quantization process, and encoding residual information including information for the quantized transform coefficient, and the residual information includes transform coefficient level information, the encoding of the residual information includes deriving a binarization value of the transform coefficient level information by performing the binarization process for the transform coefficient level information based on a rice parameter and encoding the binarization value of the transform coefficient level information, and the maximum value of the rice parameter is 3.

Yet another embodiment of the present disclosure provides an encoding apparatus for performing image encoding. The encoding apparatus includes a subtractor which derives a residual sample for a current block, a transformer which derives a transform coefficient by transforming the residual sample for the current block, a quantizer which derives a quantized transform coefficient from the transform coefficient based on a quantization process, and an entropy encoder which encodes residual information including information about the quantized transform coefficient, and the residual information includes transform coefficient level information, the entropy encoder derives a binarization value of the transform coefficient level information by performing a binarization process for the transform coefficient level information based on a rice parameter, and encodes the binarization value of the transform coefficient level information, and the maximum value of the rice parameter is 3.

According to the present disclosure, it is possible to enhance the overall image/video compaction efficiency.

According to the present disclosure, it is possible to enhance the efficiency of the residual coding.

According to the present disclosure, it is possible to enhance the residual coding efficiency by performing the binarization process on the residual information based on the rice parameters.

According to the present disclosure, it is possible to efficiently perform the residual coding by setting the maximum value of the rice parameter as 3.

According to the present disclosure, it is possible to perform the initialization process to derive at least one rice parameter for the sub-block included in the current block.

DESCRIPTION OF EXEMPLARY EMBODIMENTS

Figure 1:
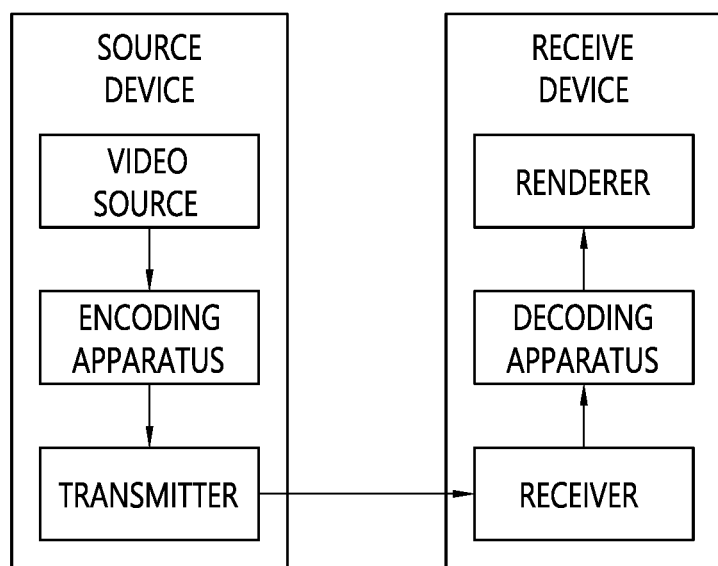
FIG. 1 is a diagram schematically illustrating an example of a video/image coding system to which the present disclosure may be applied.

An embodiment of the present disclosure provides a method for decoding an image performed by a decoding apparatus. The method includes receiving a bitstream including residual information, deriving a quantized transform coefficient for a current block based on the residual information comprised in the bitstream, deriving a transform coefficient from the quantized transform coefficient based on a dequantization process, deriving a residual sample for the current block by applying an inverse transform to the derived transform coefficient, and generating a reconstructed picture based on the residual sample for the current block, and the residual information comprises transform coefficient level information, the deriving of the quantized transform coefficient includes performing a binarization process for the transform coefficient level information based on a rice parameter, deriving a value of the transform coefficient level information based on the result of the binarization process, and deriving the quantized transform coefficient based on the value of the transform coefficient level information, and the maximum value of the rice parameter is 3.

The present disclosure may be changed variously and may have various embodiments, and specific embodiments thereof will be described in detail and illustrated in the drawings. However, this does not limit the present disclosure to specific embodiments. The terms used in the present specification are used to merely describe specific embodiments and are not intended to limit the technical spirit of the present disclosure. An expression of a singular number includes an expression of the plural number, so long as it is clearly read on the context differently. The terms such as "include" and "have" in the present specification are intended to represent that features, numbers, steps, operations, components, parts, or combinations thereof used in the specification exist, and it should be understood that the possibility of existence or addition of one or more different features, numbers, steps, operations, components, parts, or combinations thereof is not excluded in advance.

Meanwhile, each of the components in the drawings described in the present disclosure is illustrated independently for the convenience of description regarding different characteristic functions, and does not mean that each of the components is implemented in separate hardware or separate software. For example, two or more of the components may be combined to form one component, or one component may be divided into a plurality of components. Embodiments in which each component is integrated and/or separated are also included in the scope of the present disclosure without departing from the spirit of the present disclosure.

Hereinafter, preferred embodiments of the present disclosure will be described in more detail with reference to the accompanying drawings. Hereinafter, the same reference numerals are used for the same components in the drawings, and redundant description of the same components may be omitted.

FIG. 1 illustrates an example of a video/image coding system to which the present disclosure may be applied.

Referring to FIG. 1, a video/image coding system may include a first apparatus (source device) and a second apparatus (reception device). The source device may transmit encoded video/image information or data to the reception device through a digital storage medium or network in the form of a file or streaming.

The source device may include a video source, an encoding apparatus, and a transmitter. The receiving device may include a receiver, a decoding apparatus, and a renderer. The encoding apparatus may be called a video/image encoding apparatus, and the decoding apparatus may be called a video/image decoding apparatus. The transmitter may be included in the encoding apparatus. The receiver may be included in the decoding apparatus. The renderer may include a display, and the display may be configured as a separate device or an external component.

The video source may acquire video/image through a process of capturing, synthesizing, or generating the video/image. The video source may include a video/image capture device and/or a video/image generating device. The video/image capture device may include, for example, one or more cameras, video/image archives including previously captured video/images, and the like. The video/image generating device may include, for example, computers, tablets and smartphones, and may (electronically) generate video/images. For example, a virtual video/image may be generated through a computer or the like. In this case, the video/image capturing process may be replaced by a process of generating related data.

The encoding apparatus may encode input video/image. The encoding apparatus may perform a series of procedures such as prediction, transform, and quantization for compaction and coding efficiency. The encoded data (encoded video/image information) may be output in the form of a bitstream.

The transmitter may transmit the encoded image/image information or data output in the form of a bitstream to the receiver of the receiving device through a digital storage medium or a network in the form of a file or streaming. The digital storage medium may include various storage mediums such as USB, SD, CD, DVD, Blu-ray, HDD, SSD, and the like. The transmitter may include an element for generating a media file through a predetermined file format and may include an element for transmission through a broadcast/communication network. The receiver may receive/extract the bitstream and transmit the received bitstream to the decoding apparatus.

The decoding apparatus may decode the video/image by performing a series of procedures such as dequantization, inverse transform, and prediction corresponding to the operation of the encoding apparatus.

The renderer may render the decoded video/image. The rendered video/image may be displayed through the display.

This document relates to video/image coding. For example, the methods/embodiments disclosed in this document may be applied to a method which is disclosed in a versatile video coding (VVC) standard, an essential video coding (EVC) standard, an AOMedia Video 1 (AV1) standard, a 2nd generation of audio video coding standard (AVS2), or a next generation video/image coding standard (for example, 11.267, 11.268, or the like).

This document suggests various embodiments of video/image coding, and the above embodiments may also be performed in combination with each other unless otherwise specified.

In this document, a video may refer to a series of images over time. A picture generally refers to the unit representing one image at a particular time frame, and a slice/tile refers to the unit constituting the picture in terms of coding. A slice/tile may include one or more coding tree units (CTUs). One picture may consist of one or more slices/tiles. One picture may consist of one or more tile groups. One tile group may include one or more tiles. A brick may represent a rectangular region of CTU rows within a tile in a picture. A tile may be partitioned into multiple bricks, each of which consisting of one or more CTU rows within the tile. A tile that is not partitioned into multiple bricks may be also referred to as a brick. A brick scan is a specific sequential ordering of CTUs partitioning a picture in which the CTUs are ordered consecutively in CTU raster scan in a brick, bricks within a tile are ordered consecutively in a raster scan of the bricks of the tile, and tiles in a picture are ordered consecutively in a raster scan of the tiles of the picture. A tile is a rectangular region of CTUs within a particular tile column and a particular tile row in a picture. The tile column is a rectangular region of CTUs having a height equal to the height of the picture and a width specified by syntax elements in the picture parameter set. The tile row is a rectangular region of CTUs having a height specified by syntax elements in the picture parameter set and a width equal to the width of the picture. A tile scan is a specified sequential ordering of CTUs partitioning a picture in which the CTUs are ordered consecutively in CTU raster scan in a tile whereas tiles in a picture are ordered consecutively in a raster scan of the tiles of the picture. A slice includes an integer number of bricks of a picture that may be exclusively contained in a single NAL unit. A slice may consist of either a number of complete tiles or only a consecutive sequence of complete bricks of one tile. In this document, a tile group and a slice may be used interchangeably. For example, in this document, a tile group/tile group header may also be referred to as a slice/slice header.

A pixel or a pel may mean a smallest unit constituting one picture (or image). Also, 'sample' may be used as a term corresponding to a pixel. A sample may generally represent a pixel or a value of a pixel, and may represent only a pixel/pixel value of a luma component or only a pixel/pixel value of a chroma component.

A unit may represent a basic unit of image processing. The unit may include at least one of a specific region of the picture and information related to the region. One unit may include one luma block and two chroma (ex. cb, cr) blocks. The unit may be used interchangeably with terms such as block or area in some cases. In a general case, an M×N block may include samples (or sample arrays) or a set (or array) of transform coefficients of M columns and N rows.

In this document, the term "/" and "," should be interpreted to indicate "and/or." For instance, the expression "A/B" may mean "A and/or B." Further, "A, B" may mean "A and/or B." Further, "A/B/C" may mean "at least one of A, B, and/or C." Also, "A/B/C" may mean "at least one of A, B, and/or C."

Further, in the document, the term "or" should be interpreted to indicate "and/or." For instance, the expression "A or B" may comprise 1) only A, 2) only B, and/or 3) both A and B. In other words, the term "or" in this document should be interpreted to indicate "additionally or alternatively."

Figure 2:
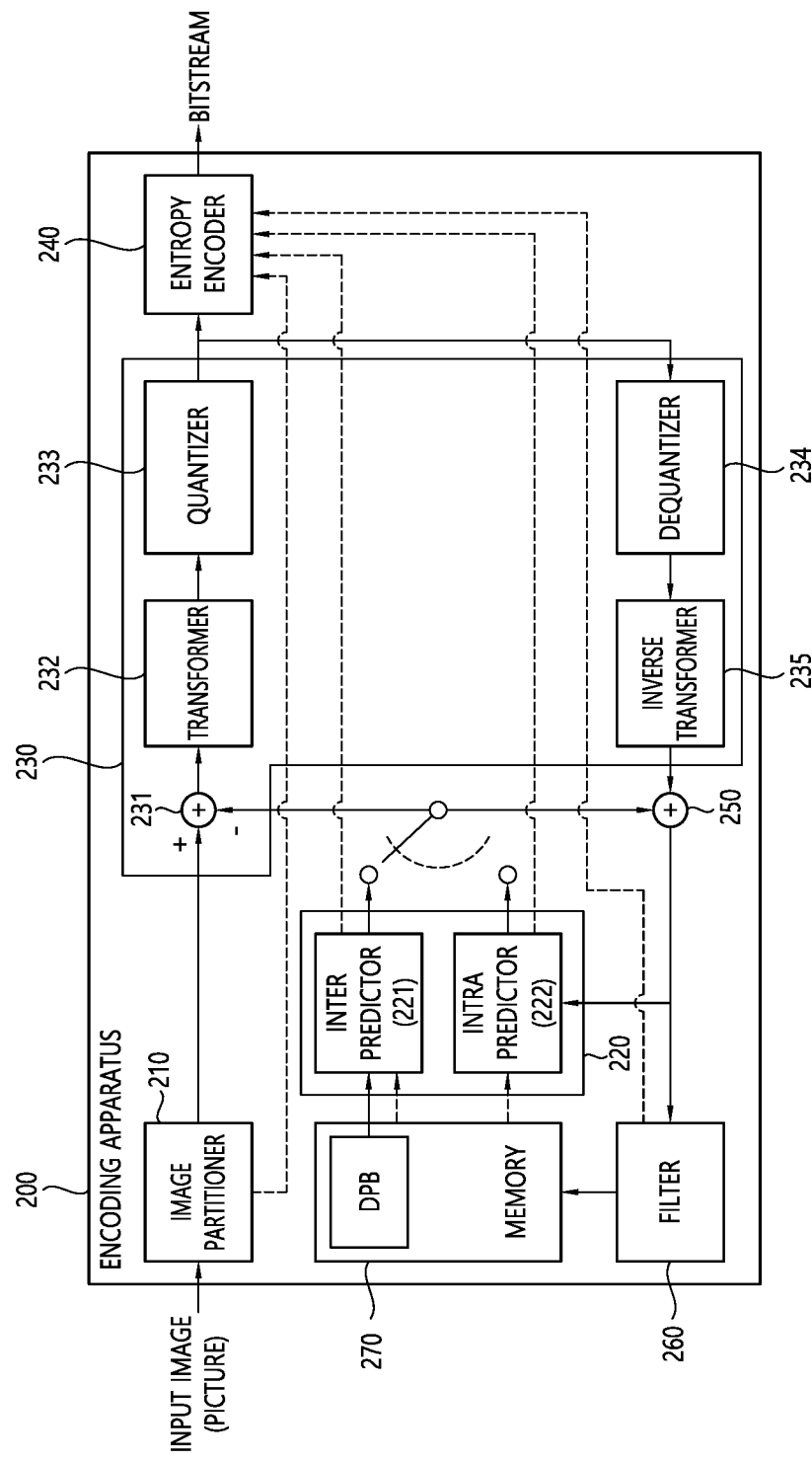
FIG. 2 is a diagram schematically explaining a configuration of a video/image encoding apparatus to which the present disclosure may be applied.

FIG. 2 illustrates a structure of a video/image encoding apparatus to which the present disclosure may be applied. In what follows, a video encoding apparatus may include an image encoding apparatus.

Referring to FIG. 2, the encoding apparatus 200 includes an image partitioner 210, a predictor 220, a residual processor 230, and an entropy encoder 240, an adder 250, a filter 260, and a memory 270. The predictor 220 may include an inter predictor 221 and an intra predictor 222. The residual processor 230 may include a transformer 232, a quantizer 233, a dequantizer 234, and an inverse transformer 235. The residual processor 230 may further include a subtractor 231. The adder 250 may be called a reconstructor or a reconstructed block generator. The image partitioner 210, the predictor 220, the residual processor 230, the entropy encoder 240, the adder 250, and the filter 260 may be configured by at least one hardware component (ex. an encoder chipset or processor) according to an embodiment. Further, the memory 270 may include a decoded picture buffer (DPB) or may be configured by a digital storage medium. The hardware component may further include the memory 270 as an internal/external component.

The image partitioner 210 may partition an input image (or a picture or a frame) input to the encoding apparatus 200 into one or more processors. For example, the processor may be called a coding unit (CU). In this case, the coding unit may be recursively partitioned according to a quad-tree binary-tree ternary-tree (QTBTTT) structure from a coding tree unit (CTU) or a largest coding unit (LCU). For example, one coding unit may be partitioned into a plurality of coding units of a deeper depth based on a quad tree structure, a binary tree structure, and/or a ternary structure. In this case, for example, the quad tree structure may be applied first and the binary tree structure and/or ternary structure may be applied later. Alternatively, the binary tree structure may be applied first. The coding procedure according to the present disclosure may be performed based on the final coding unit that is no longer partitioned. In this case, the largest coding unit may be used as the final coding unit based on coding efficiency according to image characteristics, or if necessary, the coding unit may be recursively partitioned into coding units of deeper depth and a coding unit having an optimal size may be used as the final coding unit. Here, the coding procedure may include a procedure of prediction, transform, and reconstruction, which will be described later. As another example, the processor may further include a prediction unit (PU) or a transform unit (TU). In this case, the prediction unit and the transform unit may be split or partitioned from the aforementioned final coding unit. The prediction unit may be a unit of sample prediction, and the transform unit may be a unit for deriving a transform coefficient and/or a unit for deriving a residual signal from the transform coefficient.

The unit may be used interchangeably with terms such as block or area in some cases. In a general case, an M×N block may represent a set of samples or transform coefficients composed of M columns and N rows. A sample may generally represent a pixel or a value of a pixel, may represent only a pixel/pixel value of a luma component or represent only a pixel/pixel value of a chroma component. A sample may be used as a term corresponding to one picture (or image) for a pixel or a pel.

In the encoding apparatus 200, a prediction signal (predicted block, prediction sample array) output from the inter predictor 221 or the intra predictor 222 is subtracted from an input image signal (original block, original sample array) to generate a residual signal residual block, residual sample array), and the generated residual signal is transmitted to the transformer 232. In this case, as shown, a unit for subtracting a prediction signal (predicted block, prediction sample array) from the input image signal (original block, original sample array) in the encoder 200 may be called a subtractor 231. The predictor may perform prediction on a block to be processed (hereinafter, referred to as a current block) and generate a predicted block including prediction samples for the current block. The predictor may determine whether intra prediction or inter prediction is applied on a current block or CU basis. As described later in the description of each prediction mode, the predictor may generate various information related to prediction, such as prediction mode information, and transmit the generated information to the entropy encoder 240. The information on the prediction may be encoded in the entropy encoder 240 and output in the form of a bitstream.

The intra predictor 222 may predict the current block by referring to the samples in the current picture. The referred samples may be located in the neighborhood of the current block or may be located apart according to the prediction mode. In the intra prediction, prediction modes may include a plurality of non-directional modes and a plurality of directional modes. The non-directional mode may include, for example, a DC mode and a planar mode. The directional mode may include, for example, 33 directional prediction modes or 65 directional prediction modes according to the degree of detail of the prediction direction. However, this is merely an example, more or less directional prediction modes may be used depending on a setting. The intra predictor 222 may determine the prediction mode applied to the current block by using a prediction mode applied to a neighboring block.

The inter predictor 221 may derive a predicted block for the current block based on a reference block (reference sample array) specified by a motion vector on a reference picture. Here, in order to reduce the amount of motion information transmitted in the inter prediction mode, the motion information may be predicted in units of blocks, sub-blocks, or samples based on correlation of motion information between the neighboring block and the current block. The motion information may include a motion vector and a reference picture index. The motion information may further include inter prediction direction (L0 prediction, L1 prediction, Bi prediction, etc.) information. In the case of inter prediction, the neighboring block may include a spatial neighboring block present in the current picture and a temporal neighboring block present in the reference picture. The reference picture including the reference block and the reference picture including the temporal neighboring block may be the same or different. The temporal neighboring block may be called a collocated reference block, a co-located CU (colCU), and the like, and the reference picture including the temporal neighboring block may be called a collocated picture (colPic). For example, the inter predictor 221 may configure a motion information candidate list based on neighboring blocks and generate information representing which candidate is used to derive a motion vector and/or a reference picture index of the current block. Inter prediction may be performed based on various prediction modes. For example, in the case of a skip mode and a merge mode, the inter predictor 221 may use motion information of the neighboring block as motion information of the current block. In the skip mode, unlike the merge mode, the residual signal may not be transmitted. In the case of the motion vector prediction (MVP) mode, the motion vector of the neighboring block may be used as a motion vector predictor and the motion vector of the current block may be indicated by signaling a motion vector difference.

The predictor 220 may generate a prediction signal based on various prediction methods described below. For example, the predictor may not only apply intra prediction or inter prediction to predict one block but also simultaneously apply both intra prediction and inter prediction. This may be called combined inter and intra prediction (01P). Further, the predictor may be based on an intra block copy (IBC) prediction mode or a palette mode for prediction of a block. The IBC prediction mode or palette mode may be used for content image/video coding of a game or the like, for example, screen content coding (SCC). The IBC basically performs prediction in the current picture but may be performed similarly to inter prediction in that a reference block is derived in the current picture. That is, the IBC may use at least one of the inter prediction techniques described in this document. The palette mode may be considered as an example of intra coding or intra prediction. When the palette mode is applied, a sample value within a picture may be signaled based on information on the palette table and the palette index.

The prediction signal generated by the predictor (including the inter predictor 221 and/or the intra predictor 222) may be used to generate a reconstructed signal or to generate a residual signal. The transformer 232 may generate transform coefficients by applying a transform technique to the residual signal. For example, the transform technique may include at least one of a discrete cosine transform (DCT), a discrete sine transform (DST), a Karhunen—Loève Transform (KLT), a graph-based transform (GBT), or a conditionally non-linear transform (CNT). Here, the GBT means transform obtained from a graph when relationship information between pixels is represented by the graph. The CNT refers to transform generated based on a prediction signal generated using all previously reconstructed pixels. Further, the transform process may be applied to square pixel blocks having the same size or may be applied to blocks having a variable size rather than square.

The quantizer 233 may quantize the transform coefficients and transmit them to the entropy encoder 240 and the entropy encoder 240 may encode the quantized signal (information on the quantized transform coefficients) and output a bitstream. The information on the quantized transform coefficients may be referred to as residual information. The quantizer 233 may rearrange block type quantized transform coefficients into a one-dimensional vector form based on a coefficient scanning order and generate information on the quantized transform coefficients based on the quantized transform coefficients in the one-dimensional vector form. Information on transform coefficients may be generated. The entropy encoder 240 may perform various encoding methods such as, for example, exponential Golomb, context-adaptive variable length coding (CAVLC), context-adaptive binary arithmetic coding (CABAC), and the like. The entropy encoder 240 may encode information necessary for video/image reconstruction other tha quantized transform coefficients (ex. values of syntax elements, etc.) together or separately. Encoded information (ex. encoded video/image information) may be transmitted or stored in units of NALs (network abstraction layer) in the form of a bitstream. The video/image information may further include information on various parameter sets such as an adaptation parameter set (APS), a picture parameter set (PPS), a sequence parameter set (SPS), or a video parameter set (VPS). Further, the video/image information may further include general constraint information. In this document, information and/or syntax elements transmitted/signaled from the encoding apparatus to the decoding apparatus may be included in video/picture information. The video/image information may be encoded through the above-described encoding procedure and included in the bitstream. The bitstream may be transmitted over a network or may be stored in a digital storage medium. The network may include a broadcasting network and/or a communication network, and the digital storage medium may include various storage media such as USB, SD, CD, DVD, Blu-ray, HDD, SSD, and the like. A transmitter (not shown) transmitting a signal output from the entropy encoder 240 and/or a storage unit (not shown) storing the signal may be included as internal/external element of the encoding apparatus 200, and alternatively, the transmitter may be included in the entropy encoder 240.

The quantized transform coefficients output from the quantizer 233 may be used to generate a prediction signal. For example, the residual signal (residual block or residual samples) may be reconstructed by applying dequantization and inverse transform to the quantized transform coefficients through the dequantizer 234 and the inverse transformer 235. The adder 250 adds the reconstructed residual signal to the prediction signal output from the inter predictor 221 or the intra predictor 222 to generate a reconstructed signal (reconstructed picture, reconstructed block, reconstructed sample array). If there is no residual for the block to be processed, such as a case where the skip mode is applied, the predicted block may be used as the reconstructed block. The adder 250 may be called a reconstructor or a reconstructed block generator. The generated reconstructed signal may be used for intra prediction of a next block to be processed in the current picture and may be used for inter prediction of a next picture through filtering as described below.

Meanwhile, luma mapping with chroma scaling (LMCS) may be applied during picture encoding and/or reconstruction.

The filter 260 may improve subjective/objective image quality by applying filtering to the reconstructed signal. For example, the filter 260 may generate a modified reconstructed picture by applying various filtering methods to the reconstructed picture and store the modified reconstructed picture in the memory 270, specifically, a DPB of the memory 270. The various filtering methods may include, for example, deblocking filtering, a sample adaptive offset, an adaptive loop filter, a bilateral filter, and the like. The filter 260 may generate various information related to the filtering and transmit the generated information to the entropy encoder 240 as described later in the description of each filtering method. The information related to the filtering may be encoded by the entropy encoder 240 and output in the form of a bitstream.

The modified reconstructed picture transmitted to the memory 270 may be used as the reference picture in the inter predictor 221. When the inter prediction is applied through the encoding apparatus, prediction mismatch between the encoding apparatus 200 and the decoding apparatus may be avoided and encoding efficiency may be improved.

The DPB of the memory 270 DPB may store the modified reconstructed picture for use as a reference picture in the inter predictor 221. The memory 270 may store the motion information of the block from which the motion information in the current picture is derived (or encoded) and/or the motion information of the blocks in the picture that have already been reconstructed. The stored motion information may be transmitted to the inter predictor 221 and used as the motion information of the spatial neighboring block or the motion information of the temporal neighboring block. The memory 270 may store reconstructed samples of reconstructed blocks in the current picture and may transfer the reconstructed samples to the intra predictor 222.

Figure 3:
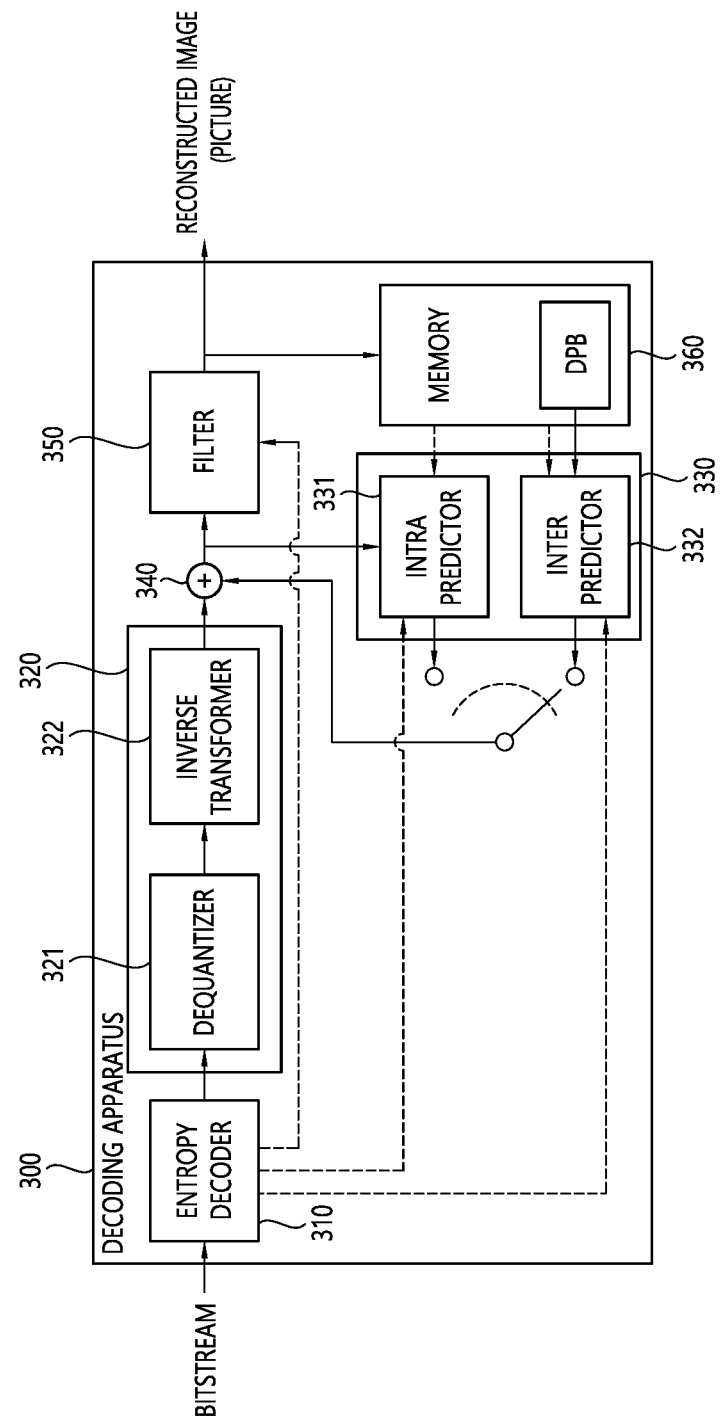
FIG. 3 is a diagram schematically explaining a configuration of a video/image decoding apparatus to which the present disclosure may be applied.

FIG. 3 illustrates a structure of a video/image decoding apparatus to which the present disclosure may be applied.

Referring to FIG. 3, the decoding apparatus 300 may include an entropy decoder 310, a residual processor 320, a predictor 330, an adder 340, a filter 350, a memory 360. The predictor 330 may include an inter predictor 331 and an intra predictor 332. The residual processor 320 may include a dequantizer 321 and an inverse transformer 321. The entropy decoder 310, the residual processor 320, the predictor 330, the adder 340, and the filter 350 may be configured by a hardware component (ex. a decoder chipset or a processor) according to an embodiment. Further, the memory 360 may include a decoded picture buffer (DPB) or may be configured by a digital storage medium. The hardware component may further include the memory 360 as an internal/external component.

When a bitstream including video/image information is input, the decoding apparatus 300 may reconstruct an image corresponding to a process in which the video/image information is processed in the encoding apparatus of FIG. 2. For example, the decoding apparatus 300 may derive units/blocks based on block partition related information obtained from the bitstream. The decoding apparatus 300 may perform decoding using a processor applied in the encoding apparatus. Thus, the processor of decoding may be a coding unit, for example, and the coding unit may be partitioned according to a quad tree structure, binary tree structure and/or ternary tree structure from the coding tree unit or the largest coding unit. One or more transform units may be derived from the coding unit. The reconstructed image signal decoded and output through the decoding apparatus 300 may be reproduced through a reproducing apparatus.

The decoding apparatus 300 may receive a signal output from the encoding apparatus of FIG. 2 in the form of a bitstream, and the received signal may be decoded through the entropy decoder 310. For example, the entropy decoder 310 may parse the bitstream to derive information (ex. video/image information) necessary for image reconstruction (or picture reconstruction). The video/image information may further include information on various parameter sets such as an adaptation parameter set (APS), a picture parameter set (PPS), a sequence parameter set (SPS), or a video parameter set (VPS). Further, the video/image information may further include general constraint information. The decoding apparatus may further decode picture based on the information on the parameter set and/or the general constraint information. Signaled/received information and/or syntax elements described later in this document may be decoded may decode the decoding procedure and obtained from the bitstream. For example, the entropy decoder 310 decodes the information in the bitstream based on a coding method such as exponential Golomb coding, CAVLC, or CABAC, and output syntax elements required for image reconstruction and quantized values of transform coefficients for residual. More specifically, the CABAC entropy decoding method may receive a bin corresponding to each syntax element in the bitstream, determine a context model using a decoding target syntax element information, decoding information of a decoding target block or information of a symbol/bin decoded in a previous stage, and perform an arithmetic decoding on the bin by predicting a probability of occurrence of a bin according to the determined context model, and generate a symbol corresponding to the value of each syntax element. In this case, the CABAC entropy decoding method may update the context model by using the information of the decoded symbol/bin for a context model of a next symbol/bin after determining the context model. The information related to the prediction among the information decoded by the entropy decoder 310 may be provided to the predictor (the inter predictor 332 and the intra predictor 331), and the residual value on which the entropy decoding was performed in the entropy decoder 310, that is, the quantized transform coefficients and related parameter information, may be input to the residual processor 320. The residual processor 320 may derive the residual signal (the residual block, the residual samples, the residual sample array). Further, information on filtering among information decoded by the entropy decoder 310 may be provided to the filter 350. Meanwhile, a receiver (not shown) for receiving a signal output from the encoding apparatus may be further configured as an internal/external element of the decoding apparatus 300, or the receiver may be a component of the entropy decoder 310. Meanwhile, the decoding apparatus according to this document may be referred to as a video/image/picture decoding apparatus, and the decoding apparatus may be classified into an information decoder (video/image/picture information decoder) and a sample decoder (video/image/picture sample decoder). The information decoder may include the entropy decoder 310, and the sample decoder may include at least one of the dequantizer 321, the inverse transformer 322, the adder 340, the filter 350, the memory 360, the inter predictor 332, and the intra predictor 331.

The dequantizer 321 may dequantize the quantized transform coefficients and output the transform coefficients. The dequantizer 321 may rearrange the quantized transform coefficients in the form of a two-dimensional block form. In this case, the rearrangement may be performed based on the coefficient scanning order performed in the encoding apparatus. The dequantizer 321 may perform dequantization on the quantized transform coefficients by using a quantization parameter (ex. quantization step size information) and obtain transform coefficients.

The inverse transformer 322 inversely transforms the transform coefficients to obtain a residual signal (residual block, residual sample array).

The predictor may perform prediction on the current block and generate a predicted block including prediction samples for the current block. The predictor may determine whether intra prediction or inter prediction is applied to the current block based on the information on the prediction output from the entropy decoder 310 and may determine a specific intra/inter prediction mode.

The predictor 320 may generate a prediction signal based on various prediction methods described below. For example, the predictor may not only apply intra prediction or inter prediction to predict one block but also simultaneously apply intra prediction and inter prediction. This may be called combined inter and intra prediction (CIIP). Further, the predictor may be based on an intra block copy (IBC) prediction mode or a palette mode for prediction of a block. The IBC prediction mode or palette mode may be used for content image/video coding of a game or the like, for example, screen content coding (SCC). The IBC basically performs prediction in the current picture but may be performed similarly to inter prediction in that a reference block is derived in the current picture. That is, the IBC may use at least one of the inter prediction techniques described in this document. The palette mode may be considered as an example of intra coding or intra prediction. When the palette mode is applied, a sample value within a picture may be signaled based on information on the palette table and the palette index.

The intra predictor 331 may predict the current block by referring to the samples in the current picture. The referred samples may be located in the neighborhood of the current block or may be located apart according to the prediction mode. In the intra prediction, prediction modes may include a plurality of non-directional modes and a plurality of directional modes. The intra predictor 331 may determine the prediction mode applied to the current block by using a prediction mode applied to a neighboring block.

The inter predictor 332 may derive a predicted block for the current block based on a reference block (reference sample array) specified by a motion vector on a reference picture. In this case, in order to reduce the amount of motion information transmitted in the inter prediction mode, motion information may be predicted in units of blocks, sub-blocks, or samples based on correlation of motion information between the neighboring block and the current block. The motion information may include a motion vector and a reference picture index. The motion information may further include inter prediction direction (L0 prediction, L1 prediction, Bi prediction, etc.) information. In the case of inter prediction, the neighboring block may include a spatial neighboring block present in the current picture and a temporal neighboring block present in the reference picture. For example, the inter predictor 332 may configure a motion information candidate list based on neighboring blocks and derive a motion vector of the current block and/or a reference picture index based on the received candidate selection information. Inter prediction may be performed based on various prediction modes, and the information on the prediction may include information representing a mode of inter prediction for the current block.

The adder 340 may generate a reconstructed signal (reconstructed picture, reconstructed block, reconstructed sample array) by adding the obtained residual signal to the prediction signal (predicted block, predicted sample array) output from the predictor (including the inter predictor 332 and/or the intra predictor 331). If there is no residual for the block to be processed, such as when the skip mode is applied, the predicted block may be used as the reconstructed block.

The adder 340 may be called reconstructor or a reconstructed block generator. The generated reconstructed signal may be used for intra prediction of a next block to be processed in the current picture, may be output through filtering as described below, or may be used for inter prediction of a next picture.

Meanwhile, luma mapping with chroma scaling (LMCS) may be applied in the picture decoding process.

The filter 350 may improve subjective/objective image quality by applying filtering to the reconstructed signal. For example, the filter 350 may generate a modified reconstructed picture by applying various filtering methods to the reconstructed picture and store the modified reconstructed picture in the memory 360, specifically, a DPB of the memory 360. The various filtering methods may include, for example, deblocking filtering, a sample adaptive offset, an adaptive loop filter, a bilateral filter, and the like.

The (modified) reconstructed picture stored in the DPB of the memory 360 may be used as a reference picture in the inter predictor 332. The memory 360 may store the motion information of the block from which the motion information in the current picture is derived (or decoded) and/or the motion information of the blocks in the picture that have already been reconstructed. The stored motion information may be transmitted to the inter predictor 260 so as to be utilized as the motion information of the spatial neighboring block or the motion information of the temporal neighboring block. The memory 360 may store reconstructed samples of reconstructed blocks in the current picture and transfer the reconstructed samples to the intra predictor 331.

In the present disclosure, the embodiments described in the filter 260, the inter predictor 221, and the intra predictor 222 of the encoding apparatus 200 may be the same as or respectively applied to correspond to the filter 350, the inter predictor 332, and the intra predictor 331 of the decoding apparatus 300. The same may also apply to the unit 332 and the intra predictor 331.

As described above, in performing video coding, prediction is performed to enhance compaction efficiency. Accordingly, a predicted block including prediction samples for a current block which is a coding target block may be generated. Here, the predicted block includes prediction samples in a spatial domain (or pixel domain). The predicted block is derived equally from an encoding apparatus and a decoding apparatus, and the encoding apparatus may signal information (residual information) about the residual between the original block and the predicted block rather than the original sample value of the original block itself to the decoding apparatus, thereby enhancing image coding efficiency. The decoding apparatus may derive a residual block including residual samples based on the residual information, generate a reconstructed block including reconstruction samples by summing the residual block and the predicted block, and generate a reconstructed picture including the restructured blocks.

The residual information may be generated through transform and quantization procedures. For example, the encoding apparatus may signal related residual information to the decoding apparatus (through a bitstream) by deriving the residual block between the original block and the predicted block, deriving transform coefficients by performing the transform procedure for the residual samples (residual sample array) included in the residual block, and deriving quantized transform coefficients by performing the quantization procedure for the transform coefficients. Here, the residual information may include information such as value information, position information, a transform technique, a transform kernel, and quantization parameters of the quantized transform coefficients. The decoding apparatus may perform dequantization/inverse transform procedures based on the residual information and derive the residual samples (or residual blocks). The decoding apparatus may generate a reconstructed picture based on the predicted block and the residual block. The encoding apparatus may also dequantize/inversely transform the quantized transform coefficients for reference for the inter prediction of the post-picture to derive the residual block, and generate the reconstructed picture based thereon.

In an embodiment, the (quantized) transform coefficients are encoded and/or decoded based on the syntax elements such as transform_skip_flag, last_sig_coeff_x_prefix, last_sig_coeff_y_prefix, last_sig_coeff_x_suffix, last_sig_coeff_y_suffix, coded_sub_block_flag, sig_coeff_flag, par_level_flag, rem_abs_gt1_flag, rem_abs_gt2_flag, abs_remainder, coeff_sign_flag, and mts_idx. Table 1 below represents the syntax elements related to the encoding of the residual data.

TABLE 1

| | Descriptor |
|---|---|
| residual_coding( x0, y0, log2TbWidth, log2TbHeight, cIdx ) { <br>  if( transform_skip_enabled_flag && <br>( cIdx != 0 \|\| cu_mts_flag[ x0 ][ y0 ] = = 0 ) && <br>    (log2TbWidth <= 2 ) && ( log2TbHeight <= 2 ) ) <br>      transform_skip_flag[ x0 ][ y0 ][ cIdx ] | ae(v) |
|   last_sig_coeff_x_prefix | ae(v) |
|   last_sig_coeff_y_prefix | ae(v) |
|   if( last_sig_coeff_x_prefix > 3 ) <br>    last_sig_coeff_x_suffix | ae(v) |
|   if( last_sig_coeff_y_prefix > 3 ) <br>    last_sig_coeff_y_suffix | ae(v) |
|   log2SbSize = ( Min( log2TbWidth, log2TbHeight ) < 2 ? 1 : 2 ) <br>  numSbCoeff = 1 << ( log2SbSize << 1 ) <br>  lastScanPos = numSbCoeff <br>  lastSub-block = ( 1 << ( log2TbWidth + log2TbHeight − 2 * log2SbSize ) ) − 1 <br>  do { <br>    if( lastScanPos = = 0 ) { <br>      lastScanPos = numSbCoeff <br>      lastSub-block− − <br>    } <br>    lastScanPos− − <br>    xS = DiagScanOrder[ log2TbWidth − log2SbSize ][ log2TbHeight − log2SbSize ] <br>            [ lastSub-block ][ 0 ] <br>    yS = DiagScanOrder[ log2TbWidth − log2SbSize ][ log2TbHeight − log2SbSize ] <br>            [ lastSub-block ][ 1 ] <br>    xC = ( xS << log2SbSize ) + <br>      DiagScanOrder[ log2SbSize ][ log2SbSize ][ lastScanPos ][ 0 ] <br>    yC = ( yS << log2SbSize ) + <br>      DiagScanOrder[ log2SbSize ][ log2SbSize ][ lastScanPos ][ 1 ] <br>  } while( ( xC != LastSignificantCoeffX ) \|\| ( yC != LastSignificantCoeffY ) ) <br>  QState = 0 <br>  for( i = lastSub-block; i >= 0; i− − ) { <br>    startQStateSb = QState <br>    xS = DiagScanOrder[ log2TbWidth − log2SbSize ][ log2TbHeight − log2SbSize ] <br>            [ lastsub-block ][ 0 ] <br>    yS = DiagScanOrder[ log2TbWidth − log2SbSize ][ log2TbHeight − log2SbSize ] <br>            [ lastSub-block ][ 1 ] <br>    inferSbDcSigCoeffFlag = 0 <br>    if( ( i < lastSub-block ) && ( i > 0 ) ) { <br>      coded_sub_block_flag[ xS ][ yS ] | ae(v) |
|       inferSbDcSigCoeffFlag = 1 <br>    } <br>    firstSigScanPosSb = numSbCoeff <br>    lastSigScanPosSb = −1 <br>    for( n = ( i = = lastSub-block ) ? lastScanPos − 1 : numSbCoeff − 1; n >= 0; n− − ) { <br>      xC = ( xS << log2SbSize ) + DiagScanOrder[ log2SbSize ][ log2SbSize ][ n ][ 0 ] <br>      yC = ( yS << log2SbSize ) + DiagScanOrder[ log2SbSize ][ log2SbSize ][ n ][ 1 ] <br>      if( coded_sub_block_flag[ xS ][ yS ] && ( n > 0 \|\| !inferSbDcSigCoeffFlag ) ) { <br>        sig_coeff_flag[ xC ][ yC ] | ae(v) |
|       } <br>      if( sig_coeff_flag[ xC ][ yC ] ) { <br>        par_level_flag[ n ] | ae(v) |
|         rem_abs_gt1_flag[ n ] <br>if( lastSigScanPosSb = = −1 ) <br>        lastSigScanPosSb = n <br>        firstSigScanPosSb = n <br>      } <br>      AbsLevelPass1[ xC ][ yC ] = <br>        sig_coeff_flag[ xC ][ yC ] + par_level_flag[ n ] + 2 * rem_abs_gt1_flag[ n ] <br>      if( dep_quant_enabled_flag ) <br>        QState = QStateTransTable[ QState ][ par_level_flag[ n ] ] <br>    } <br>    for( n = numSbCoeff − 1; n >= 0; n− − ) { <br>      if( rem_abs_gt1_flag[ n ] ) <br>        rem_abs_gt2_flag[ n ] | ae(v) |
|     } | |

TABLE 1-continued

| | Descriptor |
|---|---|
| ```
for( n = numSbCoeff − 1; n >= 0; n− − ) {
  xC = ( xS << log2SbSize ) +
DiagScanOrder[ log2SbSize ][ log2SbSize ][ n ][ 0 ]
  yC = ( yS << log2SbSize ) +
DiagScanOrder[ log2SbSize ][ log2SbSize ][ n ][ 1 ]
    if( rem_abs_gt2_flag[ n ] )
      abs_remainder[ n ]
    AbsLevel[ xC ][ yC ] = AbsLevelPass1[ xC ][ yC ] +
              2 * ( rem_abs_gt2_flag[ n ] + abs_remainder[ n ] )
}
if( dep_quant_enabled_flag | | !sign_data_hiding_enabled_flag )
  signHidden = 0
else
  signHidden = ( lastSigScanPosSb − firstSigScanPosSb > 3 ? 1 : 0 )
for( n = numSbCoeff − 1; n >= 0; n− − ) {
  xC = ( xS << log2SbSize ) +
DiagScanOrder[ log2SbSize ][ log2SbSize ][ n ][ 0 ]
  yC = ( yS << log2SbSize ) +
DiagScanOrder[ log2SbSize ][ log2SbSize ][ n ][ 1 ]
    if( sig_coeff_flag[ xC ][ yC ] &&
       ( !signHidden | | ( n = firstSigScanPosSb ) ) )
      coeff_sign_flag[ n ]
}
if( dep_quant_enabled_flag ) {
  QState = startQStateSb
  for( n = numSbCoeff − 1; n >= 0; n− − ) {
    xC = ( xS << log2SbSize ) +
        DiagScanOrder[ log2SbSize ][ log2SbSize ][ n ][ 0 ]
    yC = ( yS << log2SbSize ) +
        DiagScanOrder[ log2SbSize ][ log2SbSize ][ n ][ 1 ]
    if( sig_coeff_flag[ xC ] [ yC ] )
      TransCoeffLevel[ x0 ][ y0 ][ cIdx ][ xC ][ yC ] =
        ( 2* AbsLevel[ xC ][ yC ] − ( QState > 1 ? 1 : 0 ) ) *
        ( 1 − 2 * coeff_sign_flag[ n ] )
      QState = QStateTransTable[ QState ][ par_level_flag[ n ] ]
} else {
  sumAbsLevel = 0
  for( n = numSbCoeff − 1; n >= 0; n− − ) {
    xC = ( xS << log2SbSize ) +
        DiagScanOrder[ log2SbSize ][ log2SbSize ][ n ][ 0 ]
    yC = ( yS << log2SbSize ) +
        DiagScanOrder[ log2SbSize ][ log2SbSize ][ n ][ 1 ]
    if( sig_coeff_flag[ xC ] [ yC ] ) {
      TransCoeffLevel[ x0 ][ y0 ][ cIdx ][ xC ][ yC ] =
        AbsLevel[ xC ][ yC ] * ( 1 − 2 * coeff_sign_flag[ n ] )
      if( signHidden ) {
      sumAbsLevel += AbsLevel[ xC ][ yC ]
      if( ( n = = firstSigScanPosSb ) && ( sumAbsLevel % 2 )
= = 1 ) )
         TransCoeffLevel[ x0 ][ y0 ][ cIdx ][ xC ][ yC ] =
          −TransCoeffLevel[ x0 ][ y0 ][ cIdx ][ xC ][ yC ]
      }
    }
  }
}
}
if( cu_mts_flag[ x0 ][ y0 ] && ( cIdx = = 0 ) &&
  !transform_skip_flag[ x0 ][ y0 ][ cIdx ] &&
  ( ( CuPredMode[ x0 ][ y0 ] = = MODE_INTRA && numSigCoeff > 2 ) | |
   ( CuPredMode[ x0 ][ y0 ] = = MODE_INTER ) ) ) {
    mts_idx[ x0 ][ y0 ]
}
``` | ae(v)<br><br><br><br><br><br><br><br><br><br><br><br><br><br><br><br><br>ae(v) |

The transform_skip_flag represents whether transform is omitted in an associated block. The associated block may be a coding block (CB) or a transform block (TB). With regard to the transform (and quantization) and residual coding procedures, the CB and the TB may be used interchangeably. For example, as described above, the residual samples may be derived for the CB, and the (quantized) transform coefficients may be derived through the transform and the quantization for the residual samples, and information (for example, syntax elements) efficiently representing the position, size, sign, and the like of the (quantized) transform coefficients may be generated and signaled through the residual coding procedure. The quantized transform coefficients may simply be referred to as transform coefficients. Generally, if the CB is not larger than the maximum TB, the size of the CB may be equal to the size of the TB, and in this case, the target block to be transformed (and quantized) and residual coded may be referred to as CB or TB. Meanwhile, if the CB is larger than the maximum TB, the target block to be transformed (and quantized) and residual coded may be referred to as TB. Hereinafter, although it will be described that the syntax elements related to the residual coding are signaled in units of transform block (TB), this is an example and the TB may be used interchangeably with the coding block (CB) as described above.

In an embodiment, (x, y) position information of the last non-zero transform coefficient within the transform block may be encoded based on the syntax elements last_sig_coeff_x_prefix, last_sig_coeff_y_prefix, last_sig_coeff_x_suffix, and last_sig_coeff_y_suffix. More specifically, the last_sig_coeff_x_prefix represents the prefix of the column position of the last significant coefficient in the scanning order within the transform block, the last_sig_coeff_y_prefix represents the prefix of the row position of the last significant coefficient in the scanning order within the transform block, the last_sig_coeff_x_suffix represents the suffix of the column position of the last significant coefficient in the scanning order within the transform block, and the last_sig_coeff_y_suffix represents the suffix of the row position of the last significant coefficient in the scanning order within the transform block. Here, the significant coefficient may represent the non-zero coefficient. The scanning order may be an up-right diagonal scanning order. Alternatively, the scanning order may be a horizontal scanning order or a vertical scanning order. The scanning order may be determined based on whether intra/inter prediction is applied to the target block (CB, or CB including TB) and/or a specific intra/inter prediction mode.

Subsequently, after the transform block is split into 4×4 sub-blocks, a 1-bit syntax element coded_sub_block_flag may be used every 4×4 sub-block to represent whether there exists the non-zero coefficient within the current sub-block.

If a value of the coded_sub_block_flag is 0, there is no more information to be transmitted, such that the encoding process for the current sub-block may be terminated. Conversely, if the value of the coded_sub_block_flag is 1, the encoding process for the sig_coeff_flag may be continuously performed. Since the encoding for the coded_sub_block_flag is not necessary for the sub-block including the last non-zero coefficient, and the sub-block including DC information of the transform block has a high probability of including the non-zero coefficient, the coded_sub_block_flag is not encoded and the value thereof may be assumed to be 1.

If the value of the coded_sub_block_flag is 1 and it is determined that the non-zero coefficient exists within the current sub-block, the sig_coeff_flag having a binary value may be encoded according to the inversely scanned order. A 1-bit syntax element sig_coeff_flag may be encoded for each coefficient according to the scanning order. If the value of the transform coefficient at the current scanning position is not 0, the value of the sig_coeff_flag may be 1. Here, in the case of the sub-block including the last non-zero coefficient, since it is not necessary to encode the sig_coeff_flag for the last non-zero coefficient, the encoding process for the sub-block may be omitted. Level information may be encoded only when the sig_coeff_flag is 1, and four syntax elements may be used in the level information encoding process. More specifically, each sig_coeff_flag [xC] [yC] may represent whether the level (value) of the corresponding transform coefficient at each transform coefficient position (xC, yC) within the current TB is non-zero.

The remaining level value after the encoding for the sig_coeff_flag may be expressed by Equation 1 below. That is, the syntax element remAbsLevel representing the level value to be encoded may be expressed by Equation 1 below. Here, the coeff means an actual transform coefficient value.

$$\text{remAbsLevel}=|\text{coeff}|-1 \quad \text{Equation 1}$$

As expressed by Equation 2 below, a value of the least significant coefficient (LSB) of the remAbsLevel expressed by Equation 1 may be encoded through the par_level_flag. Here, the par_level_flag [n] may represent a parity of the transform coefficient level (value) at the scanning position (n). After the par_level_flag is encoded, a transform coefficient level value remAbsLevel to be encoded may be updated as expressed by Equation 3 below.

$$\text{par\_level\_flag}=\text{remAbsLevel}\&1 \quad \text{Equation 2}$$

$$\text{remAbsLevel}'=\text{remAbsLevel}\gg 1 \quad \text{Equation 3}$$

The rem_abs_gt1_flag may represent whether the remAbsLevel' at the corresponding scanning position (n) is larger than 1, and the rem_abs_gt2_flag may represent whether the remAbsLevel' at the corresponding scanning position (n) is larger than 2. The encoding for the abs_remainder may be performed only when the rem_abs_gt2_flag is 1. The relationship between the actual transform coefficient value (coeff) and the respective syntax elements is, for example, summarized as expressed by Equation 4 below, and Table 2 below represents examples related to Equation 4. Further, the sign of each coefficient may be encoded by using a 1-bit symbol coeff_sign_flag. The |coeff| represents the transform coefficient level (value), and may also be expressed as AbsLevel for the transform coefficient.

$$|\text{coeff}|=\text{sig\_coeff\_flag}+\text{par\_level\_flag}+2^*(\text{rem\_abs\_gt1\_flag}+\text{rem\_abs\_gt2\_flag}+\text{abs\_remainder}) \quad \text{Equation 4}$$

TABLE 2

| \|coeff\| | sig_coeff_flag | par_level_flag | rem_abs_gt1_flag | rem_abs_gt2_flag | abs_remainder |
|---|---|---|---|---|---|
| 0 | 0 | | | | |
| 1 | 1 | 0 | 0 | | |
| 2 | 1 | 1 | 0 | | |
| 3 | 1 | 0 | 1 | 0 | |
| 4 | 1 | 1 | 1 | 0 | |
| 5 | 1 | 0 | 1 | 1 | 0 |
| 6 | 1 | 1 | 1 | 1 | 0 |
| 7 | 1 | 0 | 1 | 1 | 1 |
| 8 | 1 | 1 | 1 | 1 | 1 |
| 9 | 1 | 0 | 1 | 1 | 2 |
| 10 | 1 | 1 | 1 | 1 | 2 |
| 11 | 1 | 0 | 1 | 1 | 3 |
| ... | ... | ... | ... | ... | ... |

Meanwhile, in another embodiment, the rem_abs_gt2_flag may also be referred to as rem_abs_gt3_flag, and in still another embodiment, the rem_abs_gt1_flag and the rem_abs_gt2_flag may also be represented based on abs_level_gtx_flag [n] [j]. The abs_level_gtx_flag [n] [j] may be a flag representing whether an absolute value of the transform coefficient level (or value obtained by shifting the transform coefficient level to the right by 1) at the scanning position (n) is larger than (j<<1)+1. The rem_abs_gt1_flag may perform the same and/or similar functions as abs_level_gtx_flag [n] [0], and the rem_abs_gt2_flag may perform the same and/or similar functions as abs_level_gtx_flag [n] [1]. In some cases, the (j<<1)+1 may also be replaced with a predetermined reference value such as a first reference value and a second reference value.

The binarization method for each syntax element may be expressed in Table 3 below. In Table 3, a TR means a Truncated Rice binarization method, a FL means a Fixed-Length binarization method, and a detailed description of each binarization method will be described later.

TABLE 3

| Syntax element | Binarization Process | Input parameters |
|---|---|---|
| transform_skip_flag[ ][ ][ ] | FL | cMax = 1 |
| last_sig_coeff_x_prefix | TR | cMax = ( log2TrafoSize << 1 ) − 1, cRiceParam = 0 |
| last_sig_coeff_y_prefix | TR | cMax = ( log2TrafoSize << 1 ) − 1, cRiceParam = 0 |
| last_sig_coeff_x_suffix | FL | cMax = ( 1 << ( ( last_sig_coeff_x_prefix >> 1 ) − 1 ) − 1 ) |
| last_sig_coeff_y_suffix | FL | cMax = ( 1 << ( ( last_sig_coeff_y_prefix >> 1 ) − 1 ) − 1 ) |
| coded_sub_block_flag[ ][ ] | FL | cMax = 1 |
| sig_coeff_flag[ ][ ] | FL | cMax = 1 |
| par_level_flag[ ] | FL | cMax = 1 |
| rem_abs_gt1_flag[ ] | FL | cMax = 1 |
| rem_abs_gt2_flag[ ] | FL | cMax = 1 |
| abs_remainder[ ] | 2.0.5 | cIdx, x0, y0, xC, yC, log2TbWidth, log2TbHeight |
| coeff_sign_flag[ ] | FL | cMax = 1 |
| mts_idx[ ][ ] | FL | cMax = 3 |

In an embodiment, the Truncated Rice binarization process, a parsing process for the 0th Exp-Golomb binarization process, the kth Exp-Golomb binarization process, the Fixed-Length binarization process, the binarization process for the abs_remainder, the process of deriving rice parameters, and the like may be, for example, implemented according to the following English specification.

1. Truncated Rice Binarization Process

Input to this process is a request for a truncated Rice (TR) binarization, cMax and cRiceParam.

Output of this process is the TR binarization associating each value symbolVal with a corresponding bin string.

A TR bin string is a concatenation of a prefix bin string and, when present, a suffix bin string.

For the derivation of the prefix bin string, the following applies:

The prefix value of symbolVal, prefixVal, is derived as follows:

$$\text{prefixVal} = \text{symbolVal} >> \text{cRiceParam} \quad (1)$$

The prefix of the TR bin string is specified as follows:

If prefixVal is less than cMax>>cRiceParam, the prefix bin string is a bit string of length prefixVal+1 indexed by binIdx. The bins for binIdx less than prefixVal are equal to 1. The bin with binIdx equal to prefixVal is equal to 0. Table 4 illustrates the bin strings of this unary binarization for prefixVal.

Otherwise, the bin string is a bit string of length cMax>>cRiceParam with all bins being equal to 1.

TABLE 4

| prefix Val | Bin string | | | | | |
|---|---|---|---|---|---|---|
| 0 | 0 | | | | | |
| 1 | 1 | 0 | | | | |
| 2 | 1 | 1 | 0 | | | |
| 3 | 1 | 1 | 1 | 0 | | |
| 4 | 1 | 1 | 1 | 1 | 0 | |
| 5 | 1 | 1 | 1 | 1 | 1 | 0 |
| ... | | | | | | |
| binIdx | 0 | 1 | 2 | 3 | 4 | 5 |

When cMax is larger than symbolVal and cRiceParam is larger than 0, the suffix of the TR bin string is present and it is derived as follows:

The suffix value suffixVal is derived as follows:

$$\text{suffixVal} = \text{symbolVal} - ((\text{prefixVal}) << \text{cRiceParam}) \quad (2)$$

The suffix of the TR bin string is specified by invoking the fixed-length (FL) binarization process as specified in clause 4 for suffixVal with a cMax value equal to (1<<cRiceParam)−1.

NOTE—For the input parameter cRiceParam=0, the TR binarization is exactly a truncated unary binarization and it is always invoked with a cMax value equal to the largest possible value of the syntax element being decoded.

2. Parsing Process for 0-th Order Exp-Golomb Binarization Process

Syntax elements coded as ue(v) is Exp-Golomb-coded. The parsing process for these syntax elements begins with reading the bits starting at the current location in the bitstream up to and including the first non-zero bit, and counting the number of leading bits that are equal to 0. This process is specified as follows:

leadingZeroBits=−1 for(b=0;!b;leadingZeroBits++)

$$b = \text{read\_bits}(1) \quad (3)$$

The variable codeNum is then assigned as follows:

$$\text{codeNum} = 2^{\text{leadingZeroBits}} - 1 + \text{read\_bits}(\text{leadingZeroBits}) \quad (4)$$

where the value returned from read_bits(leadingZeroBits) is interpreted as a binary representation of an unsigned integer with most significant bit written first.

Table 5 illustrates the structure of the Exp-Golomb code by separating the bit string into "prefix" and "suffix" bits. The "prefix" bits are those bits that are parsed as specified above for the computation of leadingZeroBits, and are shown as either 0 or 1 in the bit string column of Table 5. The "suffix" bits are those bits that are parsed in the computation of codeNum and are shown as $x_i$ in Table 5, with i in the range of 0 to leadingZeroBits−1, inclusive. Each $x_i$ is equal to either 0 or 1.

TABLE 5

| Bit string form | Range of codeNum |
|---|---|
| 1 | 0 |
| 0 1 $x_0$ | 1 ... 2 |
| 0 0 1 $x_1$ $x_0$ | 3 ... 6 |
| 0 0 0 1 $x_2$ $x_1$ $x_0$ | 7 ... 14 |
| 0 0 0 0 1 $x_3$ $x_2$ $x_1$ $x_0$ | 15 ... 30 |
| 0 0 0 0 0 1 $x_4$ $x_3$ $x_2$ $x_1$ $x_0$ | 31 ... 62 |
| ... | ... |

Table 6 illustrates explicitly the assignment of bit strings to codeNum values. That is, Exp-Golomb bit strings and codeNum is represented in explicit form and used as ue(v).

TABLE 6

| Bit string | codeNum |
|---|---|
| 1 | 0 |
| 0 1 0 | 1 |
| 0 1 1 | 2 |
| 0 0 1 0 0 | 3 |
| 0 0 1 0 1 | 4 |

TABLE 6-continued

| Bit string | codeNum |
|---|---|
| 0 0 1 1 0 | 5 |
| 0 0 1 1 1 | 6 |
| 0 0 0 1 0 0 0 | 7 |
| 0 0 0 1 0 0 1 | 8 |
| 0 0 0 1 0 1 0 | 9 |
| . . . | . . . |

Depending on the descriptor, the value of a syntax element is derived as follows:
If the syntax element is coded as ue(v), the value of the syntax element is equal to codeNum.

3. k-Th Order Exp-Golomb Binarization Process

Inputs to this process is a request for a k-th order Exp-Golomb (EGk) binarization.

Output of this process is the EGk binarization associating each value symbolVal with a corresponding bin string.

The bin string of the EGk binarization process for each value symbolVal is specified as follows, where each call of the function put(X), with X being equal to 0 or 1, adds the binary value X at the end of the bin string:

```
absV = Abs( symbolVal )
stopLoop = 0
do
    if( absV >= (1 << k ) ) {
        put( 1 )
        absV = absV − ( 1 << k )
        k++
    } else {
        put( 0 )                    (5)
        while( k− − )
            put( ( absV >> k ) & 1 )
        stopLoop = 1
    }
while( ! stopLoop )
NOTE - The specification for the k-th order
Exp-Golomb (EGk) code uses 1's
and 0's in reverse meaning for the unary part
of the Exp-Golomb code of 0-th order as
specified in clause 2.
```

4. Fixed-Length Binarization Process

Inputs to this process are a request for a fixed-length (FL) binarization and cMax.

Output of this process is the FL binarization associating each value symbolVal with a corresponding bin string.

FL binarization is constructed by using the fixedLength bit unsigned integer bin string of the symbol value symbolVal, where fixedLength=Ceil(Log 2(cMax+1)). The indexing of bins for the FL binarization is such that the binIdx=0 relates to the most significant bit with increasing values of binIdx towards the least significant bit.

5. Binarization Process for Abs_Remainder

Input to this process is a request for a binarization for the syntax element abs_remainder[n], the colour component cIdx, the luma location (x0, y0) specifying the top-left sample of the current luma transform block relative to the top-left luma sample of the picture), the current coefficient scan location (xC, yC), the binary logarithm of the transform block width log 2TbWidth, and the binary logarithm of the transform block height log 2TbHeight.

Output of this process is the binarization of the syntax element.

The rice parameter cRiceParam is derived by invoking the rice parameter derivation process as specified in clause 6 with the colour component index cIdx, the luma location (x0, y0), the current coefficient scan location hm of the transform block height log 2TbHeight as inputs.

The variable cMax is derived from cRiceParam as:

$$c\text{Max}=(c\text{RiceParam}==1?6:7)<<c\text{RiceParam} \quad (6)$$

The binarization of the syntax element abs_remainder[n] is a concatenation of a prefix bin string and (when present) a suffix bin string.

For the derivation of the prefix bin string, the following applies:
The prefix value of abs_remainder[n], prefixVal, is derived as follows:

$$\text{prefixVal}=\text{Min}(c\text{Max},\text{abs\_remainder}[n]) \quad (7)$$

The prefix bin string is specified by invoking the TR binarization process as specified in clause 1 for prefixVal with the variables cMax and cRiceParam as inputs.

When the prefix bin string is equal to the bit string of length 4 with all bits equal to 1, the suffix bin string is present and it is derived as follows:
The suffix value of abs_remainder[n], suffixVal, is derived as follows:

$$\text{suffixVal}=\text{abs\_remainder}[n]-c\text{Max} \quad (8)$$

The suffix bin string is specified by invoking the k-th order EGk binarization process as specified in clause 3 for the binarization of suffixVal with the Exp-Golomb order k set equal to cRiceParam+1.

6. Rice Parameter Derivation Process

Inputs to this process are the colour component index cIdx, the luma location (x0, y0) specifying the top-left sample of the current transform block relative to the top-left sample of the current picture, the current coefficient scan location (xC, yC), the binary logarithm of the transform block width log 2TbWidth, and the binary logarithm of the transform block height log 2TbHeight.

Output of this process is the Rice parameter cRiceParam.

Given the syntax elements sig_coeff_flag[x][y] and the array AbsLevel[x][C] for the transform block with component index cIdx and the top-left luma location (x0, y0), the variable locSumAbs is derived as specified by the following pseudo code:

```
locSumAbs = 0
if( xC < ( 1 << log2TbWidth) − 1 ) {
    locSumAbs += AbsLevel[ xC + 1 ][ yC ] − sig_coeff_flag
        [ xC + 1 ][ yC ]
    if( xC < (1 << log2TbWidth) − 2 )
        locSumAbs += AbsLevel[ xC + 2 ][ yC ] −
sig_coeff_flag[ xC + 2 ][ yC ]
    if( yC < (1 << log2TbHeight) − 1 )
        locSumAbs += AbsLevel[ xC + 1 ][ yC + 1 ] −
sig_coeff_flag[ xC + 1 ][ yC + 1 ]       (9)
}
if( yC < (1 << log2TbHeight) − 1 ) {
    locSumAbs += AbsLevel[ xC ][ yC + 1 ] − sig_coeff_flag
        [ xC ][ yC + 1 ]
    if( yC < (1 << log2TbHeight) − 2 )
        locSumAbsPass1 += AbsLevelPass 1 [ xC ][ yC + 2 ] −
sig_coeff_flag[ xC ][ yC + 2 ]
}
```

The Rice parameter cRiceParam is derived as follows:
If locSumAbs is less than 12, cRiceParam is set equal to 0;
Otherwise, if locSumAbs is less than 25, cRiceParam is set equal to 1;

Otherwise (locSumAbs is larger than or equal to 25), cRiceParam is set equal to 2.

Figure 4:
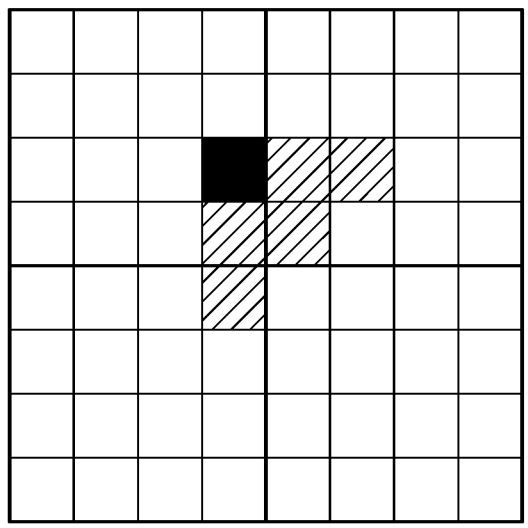
FIG. 4 is a diagram for explaining an example of deriving a rice parameter for a current transform coefficient based on neighboring reference transform coefficients according to an embodiment.

FIG. 4 is a diagram for explaining an example of deriving a rice parameter for a current transform coefficient based on neighboring reference transform coefficients according to an embodiment.

As described above in the Section 6 of the English specification illustrated in FIG. 3, the rice parameter for the transform coefficient of the current scanning position may be determined based on the level sum of the already encoded five neighboring transform coefficients (light shaded indication in FIG. 4) for the current transform coefficient (dark shaded indication in FIG. 4) and the value of the sig_coeff_flag. In this case, it may be necessary to confirm every time whether the positions of the reference transform coefficients exceed a transform block boundary. That is, every time one transform coefficient level is encoded, five boundary check processes may be accompanied. More specifically, since the 5 times of boundary check processes are required for the transform coefficient requiring the encoding of the abs_remainder syntax element, computational complexity may increase if a large number of transform coefficients having a large level value are generated.

Figure 5A:
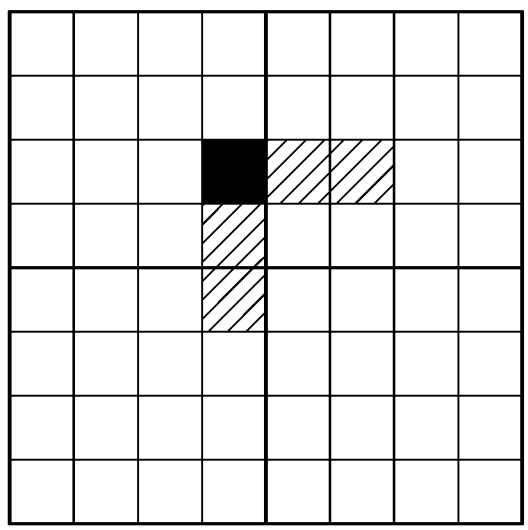
FIGS. 5A to 5C are diagrams for explaining another example of deriving a rice parameter for a current transform coefficient based on neighboring reference transform coefficients according to some embodiments.
Figure 5B:
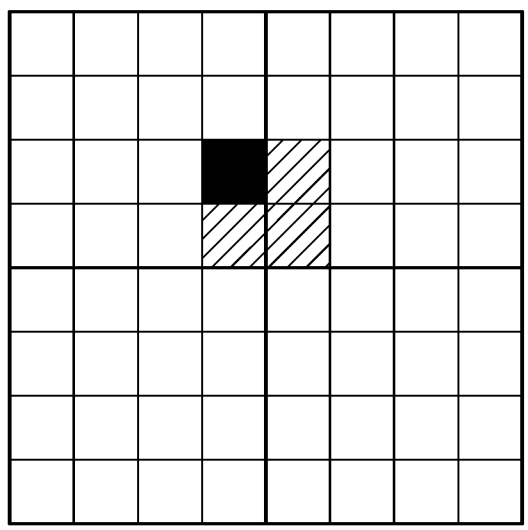
Figure 5C:
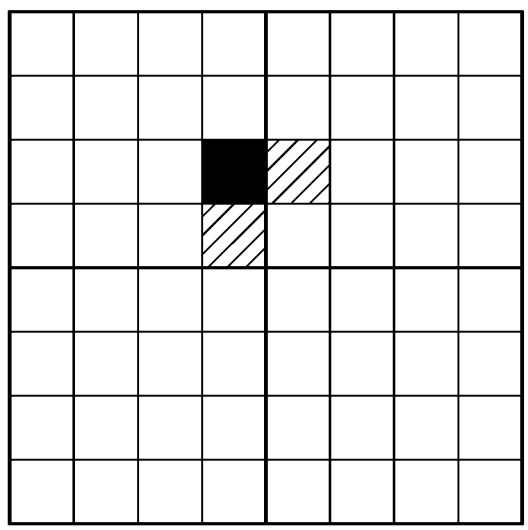
Figure 6A:
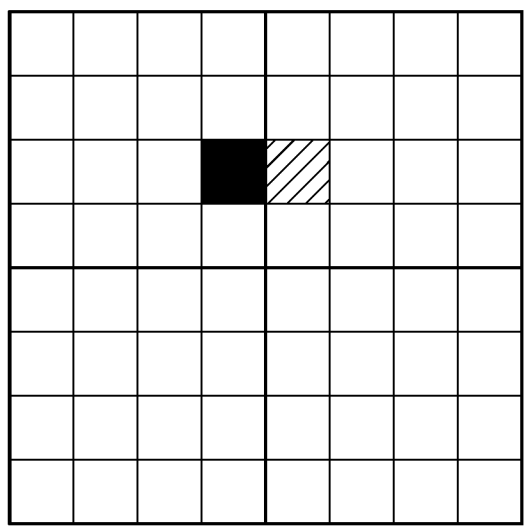
FIGS. 6A to 6C are diagrams for explaining still another example of deriving a rice parameter for a current transform coefficient based on neighboring reference transform coefficients according to another some embodiments.
Figure 6B:
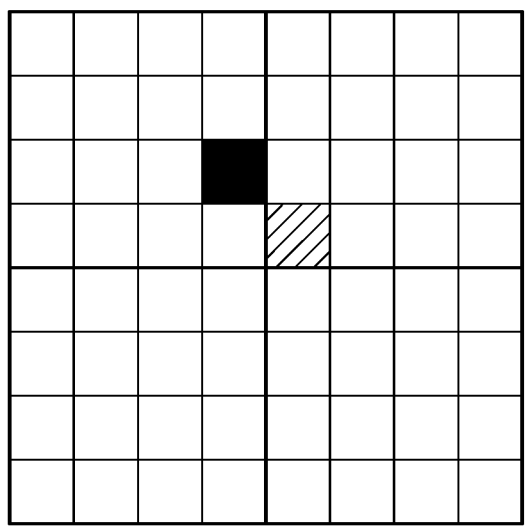
Figure 6C:
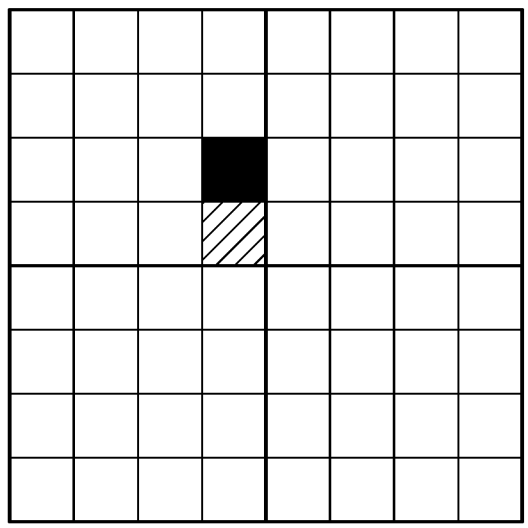

Since the computational complexity increases in proportion to the size of the reference transform coefficient used in the process of deriving the rice parameter, the following embodiments propose a method of using less than 5 reference transform coefficients. FIGS. 5A to 5C illustrate a case in which four, three, and two reference transform coefficients are used, and various reference transform coefficient usage patterns corresponding to each case are illustrated. FIGS. 6A to 6C illustrate various reference transform coefficient usage patterns in the case of using one reference transform coefficient. The purpose of the embodiments according to FIGS. 5A to 6C is to reduce the computational complexity by reducing the number of reference transform coefficients, such that the present disclosure includes all cases where less than 5 reference transform coefficients are used, and is not limited to the aforementioned embodiments.

FIGS. 5A to 5C are diagrams for explaining another example of deriving a rice parameter for the current transform coefficient based on neighboring reference transform coefficients according to some embodiments.

FIG. 5A is a diagram for explaining a process of deriving a rice parameter based on four neighboring reference transform coefficients (light shaded indication in FIG. 5A) for the current transform coefficient. A temporary sum coefficient may be derived in the middle to derive the rice parameter. The temporary sum coefficient may be represented as, for example, locSumAbs. A value of the temporary sum coefficient (for example, locSumAbs) may be initially zero, and the value of the temporary sum coefficient (for example, locSumAbs) may be updated while detecting each neighboring reference transform coefficient.

The process of updating the value of the temporary sum coefficient (for example, locSumAbs) based on the four neighboring reference transform coefficients illustrated in FIG. 5A may be, for example, expressed in Table 7 below.

TABLE 7 locSumAbS = 0
if( xC < (1 << log2Tb Width) − 1 ) {
   locSumAbs += AbsLevel[ xC + 1 ][ yC ] − sig_coeff_flag
   [ xC + 1 ][ yC ]

TABLE 7-continued if( xC < (1 << log2TbWidth) − 2 )
    locSumAbs += AbsLevel[ xC + 2 ][ yC ] − sig_coeff_flag
    [ xC + 2 ][ yC ]
}
if( yC < (1 << log2TbHeight) − 1 ) {
  locSumAbs += AbsLevel[ xC ][ yC + 1 ] − sig_coeff_flag
  [ xC ][ yC + 1 ]
  if( yC < (1 << log2TbHeight) − 2 )
    locSumAbsPass1 += AbsLevelPass1 [ xC ][ yC + 2 ] −
    sig_coeff_flag[ xC ][ yC + 2 ]
}

FIG. 5B is a diagram for explaining a process of deriving a rice parameter based on three neighboring reference transform coefficients (light shaded indication in FIG. 5B) for the current transform coefficient. The process of updating the value of the temporary sum coefficient (for example, locSumAbs) based on the three neighboring reference transform coefficients illustrated in FIG. 5B may be, for example, expressed in Table 8 below.

TABLE 8 locSumAbs = 0
if( xC < (1 << log2TbWidth) − 1 ) {
  locSumAbs += AbsLevel[ xC + 1 ][ yC ] − sig_coeff_flag
  [ xC + 1 ][ yC ]
  if( yC < (1 << log2TbHeight) − 1 )
    locSumAbs += AbsLevel[ xC + 1 ][ yC + 1 ] −
    sig_coeff_flag[ xC + 1 ][ yC + 1 ]
}
if( yC < (1 << log2TbHeight) − 1 ) {
  locSumAbs += AbsLevel[ xC ][ yC + 1 ] − sig_coeff_flag
  [ xC ][ yC + 1 ]
}

FIG. 5C is a diagram for explaining a process of deriving a rice parameter based on two neighboring reference transform coefficients (light shaded indication in FIG. 5C) for the current transform coefficient. The process of updating the value of the temporary sum coefficient (for example, locSumAbs) based on the two neighboring reference transform coefficients illustrated in FIG. 5C may be, for example, expressed in Table 9 below.

TABLE 9 locSumAbs = 0
if( xC < (1 << log2TbWidth) − 1 ) {
  locSumAbs += AbsLevel[ xC + 1 ][ yC ] − sig_coeff_flag
  [ xC ][ yC ]
}
if( yC < (1 << log2TbHeight) − 1 ) {
  locSumAbs += AbsLevel[ xC ][ yC + 1 ] − sig_coeff_flag
  [ xC ][ yC + 1 ]
}

FIGS. 6A to 6C are diagrams for explaining still another example of deriving a rice parameter for the current transform coefficient based on the neighboring reference transform coefficients according to another some embodiments.

FIGS. 6A to 6C are diagrams for explaining a process of deriving a rice parameter based on one neighboring reference transform coefficient (light shaded indication in FIGS. 6A to 6C) for the current transform coefficient. FIG. 6A is a diagram for explaining a process of using a neighboring reference transform coefficient positioned at the right of the current transform coefficient, FIG. 6B is a diagram for explaining a process of using a neighboring reference transform coefficient positioned at the lower right diagonal line of the current transform coefficient, and FIG. 6C is a diagram for explaining a process of using a neighboring reference transform coefficient positioned below the current transform coefficient.

The process of updating the value of the temporary sum coefficient (for example, locSumAbs) based on the right neighboring reference transform coefficient illustrated in FIG. 6A may be, for example, expressed in Table 10 below.

TABLE 10 locSumAbs = 0
if( xC < (1 << log2TbWidth) − 1 ) {
   locSumAbs += AbsLevel[ xC + 1 ][ yC ] − sig_coeff_flag
   [ xC + 1 ][ yC ]
}

The process of updating the value of the temporary sum coefficient (for example, locSumAbs) based on the neighboring reference transform coefficient of the lower right diagonal line illustrated in FIG. 6B may be, for example, expressed in Table 11 below.

TABLE 11 locSumAbs = 0
if( xC < (1 << log2TbWidth) − 1 ) {
   if( yC < (1 << log2TbHeight) − 1 )
     locSumAbs += AbsLevel[ xC + 1 ][ yC + 1 ] −
     sig_coeff_flag
     [ xC + 1 ][ yC + 1 ]
}

The process of updating the value of the temporary sum coefficient (for example, locSumAbs) based on the lower neighboring reference transform coefficient illustrated in FIG. 6C may be, for example, expressed in Table 12 below.

TABLE 12 locSumAbs = 0
if( yC < (1 << log2TbHeight) − 1 ) {
   locSumAbs += AbsLevel[ xC ][ yC + 1 ] −
   sig_coeff_flag[ xC ]
   [ yC + 1 ]
}

In an embodiment, as disclosed in the Section 3 of the English specification illustrated in FIG. 3, it is possible to determine a rice parameter for the transform coefficient of the next scanning position based on the locSumAbs value. For example, the rice parameter may be determined based on Equation 5 below.

$$cRiceParam = \begin{cases} 0, & locSumAbs < 12 \\ 1, & 12 \leq locSumAbs < 25 \\ 2, & locSumAbs \geq 25 \end{cases} \quad \text{Equation 5}$$

Alternatively, for example, the rice parameter may be determined based on Equation 6 below.

$$cRiceParam = \begin{cases} 0, & locSumAbs < th_1 \\ 1, & th_1 \leq locSumAbs < th_2 \\ 2, & locSumAbs \geq th_2 \end{cases} \quad \text{Equation 6}$$

In an embodiment, the $th_1$ and the $th_2$ in Equation 6 may be smaller than 12 and 25 in Equation 5, respectively, but the embodiment is not limited thereto.

In an embodiment, if the positions of the referenced neighboring reference transform coefficients exceed the boundary of the transform block, a method for predicting a rice parameter by using the transform coefficient values of the referenceable position, a method for maintaining the value of last rice parameter without updating if the last rice parameter exists, a method for replacing the value of the rice parameter with a specific initial value if the specific initial value exists, or the like may be used.

Further, a method for determining the scanning order is not limited to a diagonal scan method, and the pattern may be modified when the coefficient scan method is modified.

Figure 7:
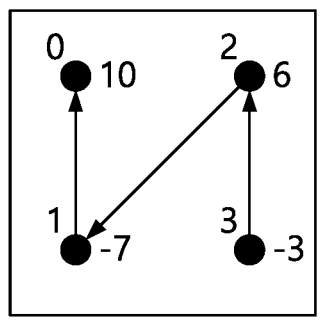
FIG. 7 is a diagram illustrating a process of deriving quantized coefficients of a 2×2 block according to an embodiment.

FIG. 7 is a diagram illustrating a process of deriving quantized coefficients of a 2×2 block according to an embodiment.

In an embodiment, FIG. 7 illustrates an example of the quantized coefficients in a 2×2 sub-block in the process of encoding a chroma block. The encoding results for the inversely diagonally scanned coefficients illustrated in FIG. 7 may be expressed in Table 13 below. In Table 13, the scan_pos represents the position of the coefficient according to the inverse diagonal scan. A coefficient which is first scanned, that is, the lower right corner coefficient in the 2×2 block may have the scan_pos value of 3, and a coefficient which is lastly scanned, that is, the upper left corner coefficient may be represented as the scan_pos value of 0.

TABLE 13

| scan_pos | 3 | 2 | 1 | 0 |
|---|---|---|---|---|
| coefficients | 4 | 6 | −7 | 10 |
| sig_coeff_flag | 1 | 1 | 1 | 1 |
| par_level_flag | 1 | 1 | 0 | 1 |
| rem_abs_gt1_flag | 1 | 1 | 1 | 1 |
| rem_abs_gt2_flag | 0 | 1 | 1 | 1 |
| abs_remainder |   | 0 | 1 | 2 |
| ceoff_sign_flag | 0 | 0 | 1 | 0 |

In an embodiment, the number of syntax elements rem_abs_gt2_flags may be limited in the encoding process for the 2×2 sub-block of the chroma block. As expressed above in Table 1, the main syntax elements in units of 2×2 sub-block may include sig_coeff_flag, par_level_flag, rem_abs_gt1_flag, rem_abs_gt2_flag, abs_remainder, coeff_sign_flag, and the like. Among them, the sig_coeff_flag, the par_level_flag, the rem_abs_gt1_flag, and the rem_abs_gt2_flag may include information about a context-encoded bin which is encoded by using the regular encoding engine, and the abs_remainder and the coeff_sign_flag may include information about a bypass bin which is encoded by using the bypass encoding engine. The context-encoded bin may exhibit high data dependency because it uses the updated probability state and range while processing the previous bin. That is, since the context-encoded bin may perform the encoding/decoding of the next bin after completely encoding/decoding of the current bin, a parallel processing may be difficult. Further, it may take a long time to read the probability section and to determine the current state. Accordingly, in an embodiment, a method for improving CABAC throughput by reducing the number of context-encoded bins and increasing the number of bypass bins may be proposed.

In an embodiment, coefficient level information may be encoded in an inverse scanning order. That is, the coefficient level information may be encoded after being scanned from the coefficients of the lower right end of the unit block toward those of the upper left end thereof. Generally, the coefficient level which is first scanned in the inverse scanning order tends to have a small value. The sig_coeff_flag, the par_level_flag, the rem_abs_gt1_flag, and the rem_abs_gt2_flag for these coefficients may be used to reduce the length of the binarized bins when the coefficient level is represented, and the respective syntax elements may be efficiently encoded through arithmetic coding according to the previously encoded context based on a predetermined context.

However, in the case of some coefficient levels having large values, that is, the coefficient levels positioned at the upper left end of the unit block, using the sig_coeff_flag, the par_level_flag, the rem_abs_gt1_flag, and the rem_abs_gt2_flag may not help to improve compaction performance. Using the sig_coeff_flag, the par_level_flag, the rem_abs_gt1_flag, and the rem_abs_gt2_flag may rather lower encoding efficiency.

In an embodiment, the number of context-encoded bins may be reduced by quickly switching the syntax elements (sig_coeff_flag, par_level_flag, rem_abs_gt1_flag, and rem_abs_gt2_flag) which are encoded into the context-encoded bins to the abs_remainder syntax element which is encoded based on the bypass encoding engine, that is, encoded into the bypass bins.

In an embodiment, the number of coefficients encoded with the rem_abs_gt2_flag may be limited. The maximum number of rem_abs_gt2_flags which may be used for encoding in the 2×2 block may be 4. That is, all coefficients whose absolute value is larger than 2 may be encoded with the rem_abs_gt2_flag. In an example, only the first N coefficients having the absolute value larger than 2 (that is, coefficients at which the rem_abs_gt1_flag is 1) may be encoded with the rem_abs_gt2_flag according to the scanning order. The N may be selected by the encoder, and may also be set as any value of 0 to 4. Assuming that the context-encoded bin for the luma or chroma 4×4 sub-block is limited to the encoder in a method similar to the present embodiment, the N may also be calculated based on the limit value used at this time. As a method for calculating the N, the limit value ($N_{4 \times 4}$) of the context-encoded bin for the luma or chroma 4×4 sub-block is used at it is as expressed by Equation 7, or the number of pixels in the 2×2 sub-block is 4, thereby calculating the N through Equation 8. Here, the a and b mean constants, and are not limited to specific values.

$$N=N_{4\times 4} \qquad \text{Equation 7}$$

$$N=\{N_{4\times 4}>>(4-a)\}+b \qquad \text{Equation 8}$$

Similarly, the N may also be calculated by using the horizontal and/or vertical size values of the sub-block. Since the sub-block has a square shape, the horizontal size value and the vertical size value are the same. Since the horizontal or vertical size value of the 2×2 sub-block is 2, the N may be calculated through Equation 9 below.

$$N=\{N_{4\times 4}>>(a-2)\}+b \qquad \text{Equation 9}$$

Table 14 below shows an application example when the N is 1. The encoding for the rem_abs_gt2_flag may be reduced as many as indicated by X in the 2×2 block, thereby reducing the number of context-encoded bins. The abs_remainder values of the coefficients may be changed with respect to the scanning positions where the encoding of the rem_abs_gt2_flag is not performed as compared to those in Table 13.

TABLE 14

| scan_pos | 3 | 2 | 1 | 0 |
|---|---|---|---|---|
| coefficients | 4 | 6 | −7 | 10 |
| sig_coeff_flag | 1 | 1 | 1 | 1 |
| par_level_flag | 1 | 1 | 0 | 1 |
| rem_abs_gt1_flag | 1 | 1 | 1 | 1 |
| rem_abs_gt2_flag | 0 | X | X | X |
| abs_remainder |  | 1 | 2 | 3 |
| ceoff_sign_flag | 0 | 0 | 1 | 0 |

In an embodiment, the sum of the number of sig_coeff_flags, the number of par_level_flags, and the number of rem_abs_gt1_flags in the encoding of the 2×2 sub-block of the chroma block may be limited. Assuming that the sum of the number of sig_coeff_flags, the number of par_level_flags, and the number of rem_abs_gt1_flags is limited to K, the K may have a value of 0 to 12. In an example, when the sum of the number of sig_coeff_flags, the number of par_level_flags, and the number of rem_abs_gt1_flags exceeds the K and the sig_coeff_flag, the par_level_flag, and the rem_abs_gt1_flag are not encoded, the rem_abs_gt2_flag may not be encoded either.

The K may be selected by the encoder, and may also be set as any value of 0 to 12. If the context-encoded bin for the luma or chroma 4×4 sub-block is limited to the encoder, the K may also be calculated based on the limit value used at this time. As a method for calculating the K, the limit value ($K_{4 \times 4}$) of the context-encoded bin for the luma or chroma 4×4 sub-block is used as it is as expressed by Equation 10 below, or the number of pixels in the 2×2 sub-block is 4, thereby calculating the K through Equation 11.

Here, the a and b mean constants, and are not limited to specific values.

$$K=K_{4\times 4} \qquad \text{Equation 10}$$

$$K=\{K_{4\times 4}>>(4-a)\}+b \qquad \text{Equation 11}$$

Similarly, the K may also be calculated by using the horizontal/vertical size values of the sub-block. Since the sub-block has a square shape, the horizontal size value and the vertical size value are the same. Since the horizontal or vertical size value of the 2×2 sub-block is 2, the K may be calculated through Equation 12.

$$K=\{K_{4\times 4}>>(a-2)\}+b \qquad \text{Equation 12}$$

Table 15 below shows the case where the K is limited to 6.

TABLE 15

| scan_pos | 3 | 2 | 1 | 0 |
|---|---|---|---|---|
| coefficients | 4 | 6 | −7 | 10 |
| sig_coeff_flag | 1 | 1 | X | X |
| par_level_flag | 1 | 1 | X | X |
| rem_abs_gt1_flag | 1 | 1 | X | X |
| rem_abs_gt2_flag | 0 | 1 | X | X |
| abs_remainder |  | 0 | 7 | 10 |
| ceoff_sign_flag | 0 | 0 | 1 | 0 |

In an embodiment, the sum of the number of sig_coeff_flags, the number of par_level_flags, and the number of rem_abs_gt1_flags, and the number of rem_abs_gt2_flags may be each limited in the encoding of the 2×2 sub-block of the chroma block. That is, a method for limiting the sum of the number of sig_coeff_flags, the number of par_level_flags, and the number of rem_abs_gt1_flags and a method for limiting the number of rem_abs_gt2_flags may also be combined. Assuming that the sum of the number of sig_coeff_flags, the number of par_level_flags, and the number of rem_abs_gt1_flags is limited to K, and the number of rem_abs_gt2_flags is limited to N, the K may have a value of 0 to 12, and the N may have a value of 0 to 4.

The K and the N may also be determined by the encoder, or may also be calculated based on the contents described with regard to Equations 7 to 12.

Table 16 below shows an example in which the K is limited to 6 and the N is limited to 1.

TABLE 16

| scan_pos | 3 | 2 | 1 | 0 |
|---|---|---|---|---|
| coefficients | 4 | 6 | −7 | 10 |
| sig_coeff_flag | 1 | 1 | X | X |
| par_level_flag | 1 | 1 | X | X |
| rem_abs_gt1_flag | 1 | 1 | X | X |
| rem_abs_gt2_flag | 0 | X | X | X |
| abs_remainder |  | 1 | 7 | 10 |
| ceoff_sign_flag | 0 | 0 | 1 | 0 |

In an embodiment, a method for changing the encoding order of the par_level_flag and the rem_abs_gt1_flag may be used. For example, a method for encoding in the order of the rem_abs_gt1_flag and the par_level_flag may be proposed without encoding in the order of the par_level_flag and the rem_abs_gt1_flag. In an example, the aforementioned change of the encoding order may be applied when the 2×2 sized sub-block of the chroma block is encoded. If the order of the par_level_flag and the rem_abs_gt1_flag is changed, the rem_abs_gt1_flag is encoded after the sig_coeff_flag, and the par_level_flag may be encoded only when the rem_abs_gt1_flag is 1. Accordingly, the relationship between the actual transform coefficient value (coeff) and the respective syntax elements may be changed as expressed by Equation 13 below.

$$|coeff|=sig\_coeff\_flag+rem\_abs\_gt1\_flag+par\_level\_flag+2*(rem\_abs\_gt2\_flag+abs\_remainder) \quad \text{Equation 13}$$

When Table 17 below is compared with Table 2, the par_level_flag is not encoded if the |coeff| is 1, such that the embodiment according to Table 16 may have advantages in terms of throughput and encoding. Of course, the rem_abs_gt2_flag is required to be encoded if the |coeff| is 2 unlike in Table 2, and the abs_remainder is required to be encoded if the |coeff| is 4 unlike in Table 2, but generally, the case where the |coeff| is 1 occurs more frequently than the case where the |coeff| is 2 or 4, such that the method according to Table 17 may exhibit higher throughput and encoding performance than the method according to Table 2. In an example, the result of encoding the 4×4 sub-block as illustrated in FIG. 7 may be expressed in Table 18 below.

TABLE 17

| \|coeff\| | sig_coeff_flag | rem_abs_gt1_flag | par_level_flag | rem_abs_gt2_flag | abs_remainder |
|---|---|---|---|---|---|
| 0 | 0 |  |  |  |  |
| 1 | 1 | 0 |  |  |  |
| 2 | 1 | 1 | 0 | 0 |  |
| 3 | 1 | 1 | 1 | 0 |  |
| 4 | 1 | 1 | 0 | 1 | 0 |
| 5 | 1 | 1 | 1 | 1 | 0 |
| 6 | 1 | 1 | 0 | 1 | 1 |
| 7 | 1 | 1 | 1 | 1 | 1 |
| 8 | 1 | 1 | 0 | 1 | 2 |
| 9 | 1 | 1 | 1 | 1 | 2 |
| 10 | 1 | 1 | 0 | 1 | 3 |
| 11 | 1 | 1 | 1 | 1 | 3 |
| ... | ... | ... | ... | ... | ... |

TABLE 18

| scan_pos | 3 | 2 | 1 | 0 |
|---|---|---|---|---|
| coefficients | 4 | 6 | −7 | 10 |
| sig_coeff_flag | 1 | 1 | 1 | 1 |
| rem_abs_gt1_flag | 1 | 1 | 1 | 1 |
| par_level_flag | 0 | 0 | 1 | 0 |
| rem_abs_gt2_flag | 1 | 1 | 1 | 1 |
| abs_remainder | 0 | 1 | 1 | 3 |
| ceoff_sign_flag | 0 | 0 | 1 | 0 |

In an embodiment, a method for changing the encoding order of the par_level_flag and the rem_abs_gt1_flag, and limiting the sum of the number of sig_coeff_flags, the number of rem_abs_gt1_flags, and the number of par_level_flags may be provided. That is, when encoding is performed in the order of the sig_coeff_flag, the rem_abs_gt1_flag, the par_level_flag, the rem_abs_gt2_flag, the abs_remainder, and the coeff_sign_flag, a method for limiting the sum of the number of sig_coeff_flags, the number of rem_abs_gt1_flags, and the number of par_level_flags may be provided. Assuming that the sum of the number of sig_coeff_flags, the number of rem_abs_gt1_flags, and the number of par_level_flags is limited to K, the K may have a value of 0 to 12. The K may also be selected by the encoder, and may also be set as any value of 0 to 12. Further, the K may be calculated based on the aforementioned method with regard to Equations 10 to 12.

In an embodiment, when the sig_coeff_flag, the rem_abs_gt1_flag, and the par_level_flag are no longer encoded, the rem_abs_gt2_flag may not be encoded either. Table 19 below shows an example in which the K is 6.

TABLE 19

| scan_pos | 3 | 2 | 1 | 0 |
|---|---|---|---|---|
| coefficients | 4 | 6 | −7 | 10 |
| sig_coeff_flag | 1 | 1 | X | X |
| rem_abs_gt1_flag | 1 | 1 | X | X |
| par_level_flag | 0 | 0 | X | X |
| rem_abs_gt2_flag | 1 | 1 | X | X |
| abs_remainder | 0 | 1 | 7 | 10 |
| ceoff_sign_flag | 0 | 0 | 1 | 0 |

In an embodiment, the syntax elements sig_coeff_flag, rem_abs_gt1_flag and par_level_flag may be encoded within one for loop in the syntax. Although the sum of the number of three syntax elements (sig_coeff_flag, rem_abs_gt1_flag, and par_level_flag) does not exceed K, and the sum does not exactly match the K, the encoding may be stopped at the same scanning position. Table 19 below shows an example in which the K is 8. When encoding is performed up to a scanning position 2, the sum of the number of sig_coeff_flags, the number of rem_abs_gt1_flags, and the number of par_level_flags is 6. The sum is a value which does not exceed the K, but at this time, since the encoding apparatus (or encoder) does not know the value of the coefficient level of the next scanning position 1 (scan_pos=1), the encoding apparatus (or encoder) may not recognize that the number of context-encoded bins generated in the scan_pos=1 has any value of 1 to 3. At this time, the encoding apparatus may encode only up to the scan_pos=2 and terminate the encoding. Accordingly, although the K value is different, the encoding results may be the same in Table 19 and Table 20 below.

TABLE 20

| scan_pos | 3 | 2 | 1 | 0 |
|---|---|---|---|---|
| coefficients | 4 | 6 | −7 | 10 |
| sig_coeff_flag | 1 | 1 | X | X |
| rem_abs_gt1_flag | 1 | 1 | X | X |
| par_level_flag | 0 | 0 | X | X |
| rem_abs_gt2_flag | 1 | 1 | X | X |
| abs_remainder | 0 | 1 | 7 | 10 |
| ceoff_sign_flag | 0 | 0 | 1 | 0 |

In an embodiment, a method for changing the encoding order of the par_level_flag and the rem_abs_gt1_flag, and limiting the number of rem_abs_gt2_flags may be provided. That is, when encoding is performed in the order of the sig_coeff_flag, the rem_abs_gt1_flag, the par_level_flag, the rem_abs_gt2_flag, the abs_remainder, and the coeff_sign_flag, a method for limiting the sum of the number of coefficients encoded with the rem_abs_gt2_flag may be provided. In an example, the number of rem_abs_gt2_flags encoded within the 2×2 block may be 4. That is, all coefficients whose absolute value is larger than 2 may be encoded with the rem_abs_gt2_flag. In another example, only the first N coefficients having an absolute value larger than 2 (that is, coefficients at which the rem_abs_gt1_flag is 1) may also be encoded with the rem_abs_gt2_flag according to the scanning order. The N may also be selected by the encoder, and may also be set as any value of 0 to 4. Further, the N may also be calculated based on the aforementioned method with regard to Equations 7 to 9.

Table 21 shows an example when the N is 1. The encoding for the rem_abs_gt2_flag may be reduced as many as indicated by X in the 4×4 block, thereby reducing the number of context-encoded bins. The abs_remainder values of coefficients may be changed with respect to the scanning positions where the rem_abs_gt2_flag is not encoded as expressed in Table 21 below as compared with those in Table 18.

TABLE 21

| scan_pos | 3 | 2 | 1 | 0 |
|---|---|---|---|---|
| coefficients | 4 | 6 | −7 | 10 |
| sig_coeff_flag | 1 | 1 | 1 | 1 |
| rem_abs_gt1_flag | 1 | 1 | 1 | 1 |
| par_level_flag | 0 | 0 | 1 | 0 |
| rem_abs_gt2_flag | 1 | X | X | X |
| abs_remainder | 0 | 2 | 2 | 4 |
| ceoff_sign_flag | 0 | 0 | 1 | 0 |

In an embodiment, a method for changing the encoding order of the par_level_flag and the rem_abs_gt1_flag, and limiting the sum of the number of sig_coeff_flags, the number of rem_abs_gt1_flags, and the number of par_level_flags, and the number of rem_abs_gt2_flags may be provided. That is, when encoding is performed in the order of the sig_coeff_flag, the rem_abs_gt1_flag, the par_level_flag, the rem_abs_gt2_flag, the abs_remainder, and the coeff_sign_flag, the method for limiting the sum of the number of sig_coeff_flags, the number of rem_abs_gt1_flags, and the number of par_level_flags and the method for limiting the number of rem_abs_gt2_flags may be combined. Assuming that the sum of the number of sig_coeff_flags, the number of rem_abs_gt1_flags, and the number of par_level_flags is limited to K, and the number of rem_abs_gt2_flags is limited to N, the K may have a value of 0 to 12, and the N may have a value of 0 to 4. The K and the N may also be selected by the encoder, and the K may also be set as any value of 0 to 12 and the N may also be set as any value of 0 to 4. Alternatively, the K and the N may also be calculated based on the contents described with regard to Equations 7 to 12.

Table 22 shows an example in which the K is 6 and the N is 1.

TABLE 22

| scan_pos | 3 | 2 | 1 | 0 |
|---|---|---|---|---|
| coefficients | 4 | 6 | −7 | 10 |
| sig_coeff_flag | 1 | 1 | X | X |
| rem_abs_gt1_flag | 1 | 1 | X | X |
| par_level_flag | 0 | 0 | X | X |
| rem_abs_gt2_flag | 1 | X | X | X |
| abs_remainder | 0 | 2 | 7 | 10 |
| ceoff_sign_flag | 0 | 0 | 1 | 0 |

According to an embodiment, in the case of limiting the sum of the number of sig_coeff_flags, the number of par_level_flags, and the number of rem_abs_gt1_flags in the encoding of the 2×2 or 4×4 sub-block of the chroma block, a method for simplifying determining the rice parameter used to define golomb codes for the abs_remainder may be provided. In an embodiment, referring back to FIG. 4, the rice parameter for the transform coefficient of the current scanning position may be determined based on the level sum of the already encoded neighboring five transform coefficients (light shaded indication in FIG. 4) of the current transform coefficient (dark shaded indication in FIG. 4) and information about the sig_coeff_flag. Table 22 below shows the pseudo code related to FIG. 4. Referring to Table 23 below, it may be confirmed that it is necessary to check every time whether the positions of the transform coefficients referred to in the pseudo code exceed the transform block boundary. That is, it is necessary to perform five boundary check processes every time one transform coefficient level is encoded. Even in the encoding of the abs_remainder syntax element, since the 5 times of boundary check processes are required for the transform coefficient of the target which requires the encoding, the computational complexity may increase if a large number of transform coefficients having large level values are generated.

TABLE 23

```
locSumAbs = 0
if( xC < (1 << log2TbWidth) − 1 ) {
  locSumAbs += AbsLevel[ xC + 1 ][ yC ] − sig_coeff_flag
    [ xC + 1 ][ yC ]
  if( xC < (1 << log2TbWidth) − 2 )
    locSumAbs += AbsLevel[ xC + 2 ][ yC ] −
    sig_coeff_flag [ xC + 2 ][ yC ]
  if( yC < (1 << log2TbHeight) − 1 )
    locSumAbs += AbsLevel[ xC + 1 ][ yC + 1 ] −
    sig_coeff_flag
      [ xC + 1 ][ yC + 1 ]
}
```

TABLE 23-continued

```
if( yC < (1 << log2TbHeight) - 1 ) {
   locSumAbs += AbsLevel[ xC ][ yC + 1 ] - sig_coeff_flag
   [ xC ][ yC + 1 ]
   if( yC < (1 << log2TbHeight) - 2 )
      locSumAbsPass1 += AbsLevelPass1 [ xC ][ yC + 2 ] -
      sig_coeff_flag[ xC ][ yC + 2 ]
}
```

According to an embodiment, in a method for deriving cRiceParam representing a rice parameter, a value of the cRiceParam may be 0 if locSumAbs is less than 12, the value of the cRiceParam may be 1 if the locSumAbs is less than 25, and the value of the cRiceParam may be 2 if the value of the locSumAbs is 25 or more.

In an embodiment, if the sum of the number of sig_coeff_flags, the number of rem_abs_gt1_flags, and the number of par_level_flags is limited, the abs_remainder may be determined differently, respectively, according to the following three cases. In the method for limiting the sum of the number of sig_coeff_flags, the number of rem_abs_gt1_flags, and the number of par_level_flags, various coding processes may be applied to sub-blocks according to the following (i), (ii), and (iii). The (i) may represent a case where all of the sig_coeff_flag, the par_level_flag, the rem_abs_gt1_flag, and the rem_abs_gt2_flag exist, the (ii) represent a case where only the sig_coeff_flag, the par_level_flag, and the rem_abs_gt1_flag exist, and the (iii) represent a case where none of the sig_coeff_flag, the par_level_flag, the rem_abs_gt1_flag, and the rem_abs_gt2_flag exist.

In the case of the (i), the relationship between the actual transform coefficient value (coeff) and the abs_remainder is expressed by Equation 4, in the case of the (ii) the relationship therebetween is as expressed by Equation 14, and in the case of the (iii), the relationship therebetween is as expressed by Equation 15.

|coeff|=sig_coeff_flag+par_level_flag+2*
(rem_abs_gt1_flag+abs_remainder)    Equation 14

|coeff|=abs_remainder    Equation 15

Since the computational complexity increases in proportion to the size of the reference transform coefficient used in the process of deriving the rice parameter, an embodiment may derive the rice parameter based on the just before level value under the scanning order of the 4×4 or 2×2 sub-block only for the encoding of the chroma block. At this time, the rice parameter may be initialized to zero only in the start step of the sub-block, and each step of the (i), (ii), and (iii) which encode the abs_remainder within the sub-block may not initialize the rice parameter. In the encoding of the sub-block, the rice parameter increases by 1 when the just before level value is larger than $th_1$, $th_2$ or $th_3$. In the present disclosure, the $th_1$ and the $th_2$ are not limited to specific values, but in an embodiment, the $th_1$ may be determined as 1, 2 or 3, $th_2$ may be determined as 4, 5 or 6, and $th_3$ may be determined as 10, 11 or 12.

According to an embodiment, in the case of changing the encoding order of the par_level_flag and rem_abs_gt1_flag in the encoding of the 2×2 or 4×4 sub-block of the chroma block, and limiting the sum of the number of sig_coeff_flags, the number of rem_abs_gt1_flags, and the number of par_level_flags, a method for simplifying the determining of the rice parameter used to define the golomb codes for the abs_remainder may be provided.

In the case of changing the encoding order of the par_level_flag and the rem_abs_gt1_flag, the abs_remainder may be determined differently, respectively, according to the following three cases if the sum of the number of sig_coeff_flags, the number of rem_abs_gt1_flags, and the number of par_level_flags is limited. According to the method for limiting the sum of the number of sig_coeff_flags, the number of rem_abs_gt1_flags, and the number of par_level_flags, the following (i), (ii), and (iii) may be checked with regard to one sub-block. The (i) is a case where all of the sig_coeff_flag, the rem_abs_gt1_flag, the par_level_flag, and the rem_abs_gt2_flag exist, the (ii) is a case where only the sig_coeff_flag, the rem_abs_gt1_flag, and the par_level_flag exist, and the (iii) is a case where all of the sig_coeff_flag, the rem_abs_gt1_flag, the par_level_flag, and rem_abs_gt2_flag do not exist.

In the case of the (i), the relationship between the actual transform coefficient value (coeff) and the abs_remainder is expressed by Equation 13, in the case of the (ii), the relationship therebetween is expressed by Equation 16, and in the case of the (iii), the relationship therebetween is expressed by Equation 15.

|coeff|=sig_coeff_flag+rem_abs_gt1_flag+par_level_flag+(2*abs_remainder)    Equation 16

Since the computational complexity increases in proportion to the size of the reference transform coefficient used in the process of deriving the rice parameter, an embodiment may provide a method for driving the rice parameter by using the just before level value under the scanning order of the 4×4 or 2×2 sub-block only for the encoding of the chroma block. The rice parameter may be initialized to zero only in the start step of the sub-block, and in each stage of the (i), (ii) and (iii) which encode the abs_remainder within the sub-block, the rice parameter may not be initialized. In the encoding of the sub-block, the rice parameter may increase by 1 when the just before level value is larger than $th_1$, $th_2$ or $th_3$. In the present disclosure, the $th_1$ and the $th_2$ are not limited to specific values, but in an embodiment, the $th_1$ may be determined as 1, 2 or 3, the $th_2$ may be determined as 4, 5 or 6, and the $th_3$ may be determined as 10, 11 or 12.

Figure 8A:
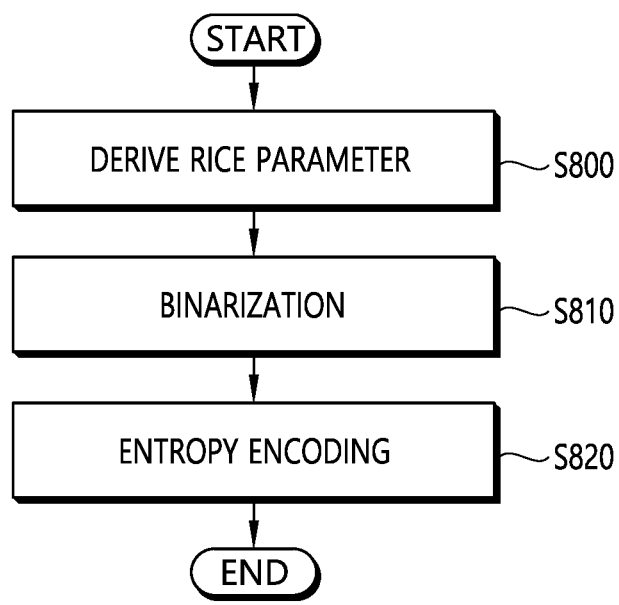
FIGS. 8A and 8B are diagrams illustrating a configuration and an operation method of an entropy encoder according to an embodiment.
Figure 8B:
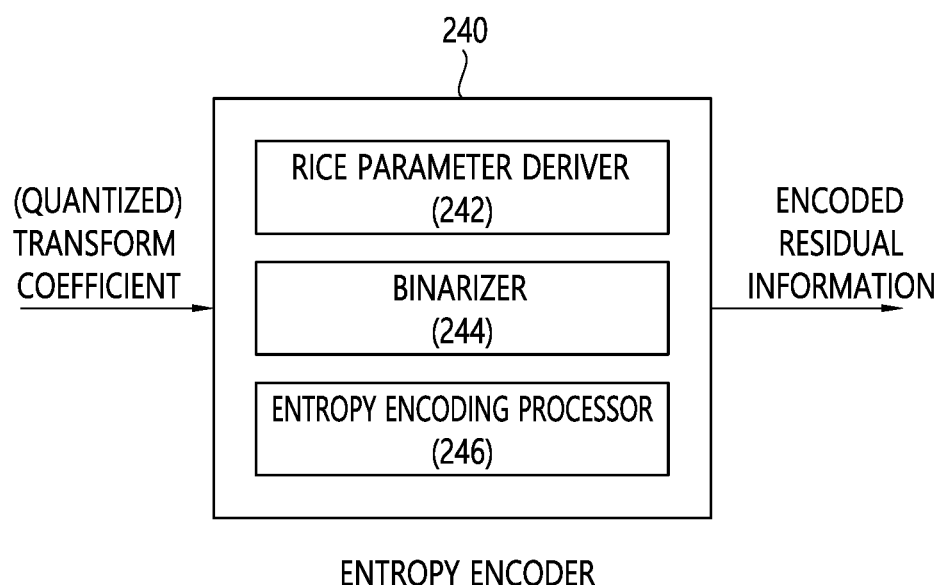

FIGS. 8A and 8B are diagrams illustrating a configuration and an operation method of an entropy encoder according to an embodiment.

According to an embodiment, from 0th rice code to a maximum 2th rice code may be used, and the order of the rice code may be expressed as a rice parameter. If the order of the rice code, that is, the value of the maximum rice parameter is increased, there may be an advantage in that fewer bits may be assigned if a large input value is input. Table 24 below shows the codeword length from the 0th rice code to the 3rd rice code as an example, and it may be confirmed that the binarization with the 3rd rice code is shorter in resulting codeword length than the binarization with the 2nd rice code if the input value is larger than 11. Accordingly, in an embodiment, a method for increasing the order of the maximum supported rice code, that is, the value of the maximum rice parameter in the transform coefficient level encoding may be provided.

TABLE 24

| value | cRiceParam = 0 | cRiceParam = 1 | cRiceParam = 2 | cRiceParam = 3 |
|---|---|---|---|---|
| 0 | 1 | 2 | 3 | 4 |
| 1 | 2 | 2 | 3 | 4 |
| 2 | 3 | 3 | 3 | 4 |

TABLE 24-continued

| value | cRice-Param = 0 | cRice-Param = 1 | cRice-Param = 2 | cRice-Param = 3 |
|---|---|---|---|---|
| 3 | 4 | 3 | 3 | 4 |
| 4 | 5 | 4 | 4 | 4 |
| 5 | 6 | 4 | 4 | 4 |
| 6 | 7 | 5 | 4 | 4 |
| 7 | 9 | 5 | 4 | 4 |
| 8 | 9 | 6 | 5 | 5 |
| 9 | 11 | 6 | 5 | 5 |
| 10 | 11 | 7 | 5 | 5 |
| 11 | 11 | 7 | 5 | 5 |
| 12 | 11 | 9 | 6 | 5 |
| 13 | 13 | 9 | 6 | 5 |
| 14 | 13 | 9 | 6 | 5 |
| 15 | 13 | 9 | 6 | 5 |
| 16 | 13 | 11 | 7 | 6 |
| 17 | 13 | 11 | 7 | 6 |
| 18 | 13 | 11 | 7 | 6 |
| 19 | 13 | 11 | 7 | 6 |
| 20 | 13 | 11 | 8 | 6 |
| 21 | 15 | 11 | 8 | 6 |
| 22 | 15 | 11 | 8 | 6 |
| 23 | 15 | 11 | 8 | 6 |
| 24 | 15 | 13 | 9 | 7 |
| 25 | 15 | 13 | 9 | 7 |
| 26 | 15 | 13 | 9 | 7 |
| 27 | 15 | 13 | 9 | 7 |
| 28 | 15 | 13 | 11 | 7 |
| 29 | 15 | 13 | 11 | 7 |
| 30 | 15 | 13 | 11 | 7 |
| 31 | 15 | 13 | 11 | 7 |

As the maximum rice parameter increases, Equation 6, which classifies the rice parameter based on the locSumAbs, may be modified as expressed by Equation 17 below. Equation 17 shows an example of the case of using up to the 3rd rice code.

$$cRiceParam = \begin{cases} 0, & locSumAbs < th_1 \\ 1, & th_1 \leq locSumAbs < th_2 \\ 2, & th_2 \leq locSumAbs < th_3 \\ 3, & locSumAbs \geq th_3 \end{cases} \quad \text{Equation 17}$$

Referring to FIGS. 8A and 8B, the encoding apparatus (entropy encoder 240) may perform a residual coding procedure for (quantized) transform coefficients. As described above, the encoding apparatus may residual code the (quantized) transform coefficients within the current block (current CB or current TB) according to the scanning order. The encoding apparatus may generate and encode various syntax elements related to residual information, for example, as expressed in Table 1.

Specifically, the encoding apparatus may derive a value of the abs_remainder while encoding the sig_coeff_flag, the par_level_flag, the rem_abs_gt1_flag, and the rem_abs_gt2_flag, and derive a rice parameter for the abs_remainder (S800). The rice parameter may be derived based on the neighboring reference transform coefficient as described above. More specifically, the rice parameter for (the transform coefficient of) the current scanning position may be derived based on the aforementioned locSumAbs, and the locSumAbs may be derived based on the AbsLevel and/or the sig_coeff_flag of the neighboring reference transform coefficients. The positions and number of the neighboring reference transform coefficients may include the contents described in FIGS. 4 to 6C. The procedure of deriving the rice parameter may be performed by a rice parameter deriver 242 within the entropy encoder 240.

The encoding apparatus may perform binarization on the value of the abs_remainder based on the derived rice parameter (S810). In the binarization procedure, the aforementioned description may be applied in the Section 5 (binarization process for abs_remainder) of the English specification included in the description of FIG. 3. The encoding apparatus may derive a bin string for the abs_remainder through the binarization procedure. The binarization procedure may be performed by a binarizer 244 within the entropy encoder 240. According to the present disclosure, as described above, the length of the bin string for the value of the abs_remainder may be determined adaptively based on the rice parameter. For example, as expressed in Table 23, the length of the value to be encoded may be adaptively determined based on the rice parameter. According to the present disclosure, the rice parameter for the value of the abs_remainder of the current transform coefficient may be derived based on the neighboring reference transform coefficients, and accordingly, a relatively shorter bin string may be assigned adaptively than when the fixed rice parameter is used with respect to the value of the abs_remainder of the current transform coefficient.

It is apparent to those skilled in the art that the procedure of deriving the rice parameter may be omitted for the sig_coeff_flag, the par_level_flag, the rem_abs_gt1_flag, the rem_abs_gt2_flag, and the like which are binarized based on the FL without using the rice parameter. The sig_coeff_flag, the par_level_flag, the rem_abs_gt1_flag, the rem_abs_gt2_flag, and the like may not be binarized based on the rice parameter, but binarized according to the Section 4 (Fixed-length binarization process) of the English specification included in the description of FIG. 3.

The encoding apparatus may perform entropy encoding based on the bin string for the abs_remainder (S820). The encoding apparatus may entropy encode the bin string based on the context based on an entropy coding technique such as context-adaptive arithmetic coding (CABAC) or context-adaptive variable length coding (CAVLC), and the output thereof may be included in a bitstream. The entropy encoding procedure may be performed by an entropy encoding processor 244 within the entropy encoder 240. As described above, the bitstream may include various information for image/video decoding such as prediction information in addition to the residual information including the information about the abs_remainder. The bitstream may be delivered to the decoding apparatus through a (digital) storage medium or a network.

Figure 9A:
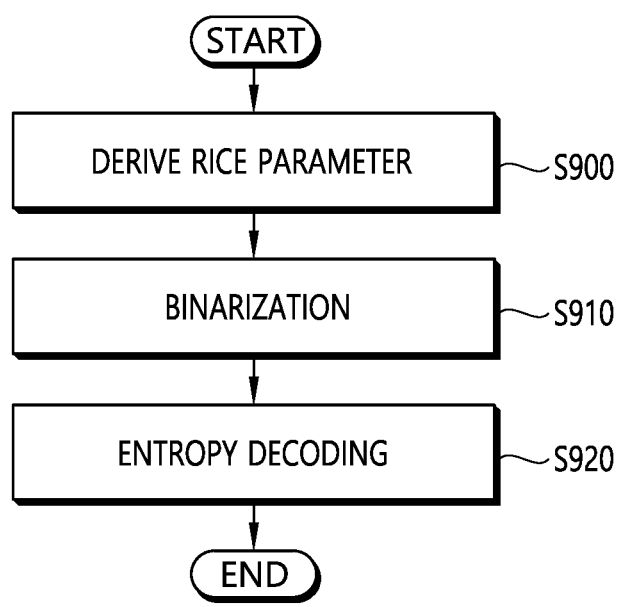
FIGS. 9A and 9B are diagrams illustrating a configuration and an operation method of an entropy decoder according to an embodiment.
Figure 9B:
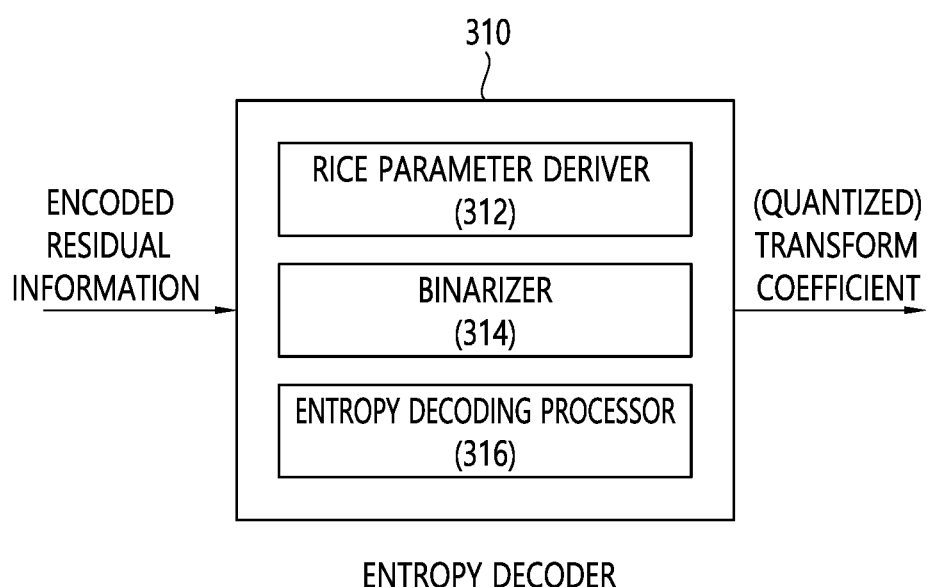

FIGS. 9A and 9B are diagrams illustrating a configuration and an operation method of an entropy decoder according to an embodiment.

Referring to FIGS. 9A and 9B, the decoding apparatus (entropy decoder) may decode the encoded residual information to derive (quantized) transform coefficients. As described above, the decoding apparatus may decode the encoded residual information for the current block (current CB or current TB) to derive the (quantized) transform coefficients. For example, the decoding apparatus may decode various syntax elements related to the residual information as expressed in Table 1, and derive the (quantized) transform coefficients based on the values of related syntax elements.

Specifically, the decoding apparatus may derive a rice parameter for the abs_remainder (S900). As described above, the rice parameter may be derived based on the neighboring reference transform coefficient. Specifically, the rice parameter for (the transform coefficient of) the current scanning position may be derived based on the aforementioned locSumAbs, and the locSumAbs may be derived based on the AbsLevel and/or the sig_coeff_flag of the neighboring reference transform coefficients. The positions and number of the neighboring reference transform coefficients may include the aforementioned descriptions in FIGS. 4 to 6C. The procedure of deriving the rice parameter may be performed by the rice parameter deriver 312 in the entropy decoder 310.

The decoding apparatus may perform binarization for the abs_remainder based on the derived rice parameter (S910). In the binarization procedure, the aforementioned description may be applied in the Section 5 (Binarization process for abs_remainder) of the English specification included in the description of FIG. 3. The decoding apparatus may derive available bin strings for available values of the abs_remainder through the binarization procedure. The binarization procedure may be performed by the binarizer 314 in the entropy decoder 310. According to the present disclosure, as described above, the length of the bin string for the value of the abs_remainder may be determined adaptively based on the rice parameter. For example, as expressed in Table 23, the length of the value to be encoded may be adaptively determined based on the rice parameter. According to the present disclosure, the rice parameter for the value of the abs_remainder of the current transform coefficient may be derived based on the neighboring reference transform coefficients, and accordingly, a relatively shorter bin string may be assigned adaptively than when the fixed rice parameter is used with respect to the value of the abs_remainder of the current transform coefficient.

The decoding apparatus may perform entropy decoding for the abs_remainder (S920). The decoding apparatus may parse and decode each bin for the abs_remainder sequentially, and compare the derived bin string with the available bin strings. If the derived bin string is equal to one of the available bin strings, a value corresponding to the corresponding bin string may be derived as the value of the abs_remainder. Otherwise, the comparison procedure may be performed after further parsing and decoding the next bit within the bitstream. Through such a process, the corresponding information may be signaled by using a variable length bit even without using a start bit or an end bit for specific information (specific syntax element) within the bitstream. Accordingly, the decoding apparatus may assign relatively fewer bits to a low value, and improve overall coding efficiency.

The decoding apparatus may perform context-based entropy decoding for the respective bins within the bin string from the bitstream based on an entropy coding technique such as CABAC or CAVLC. The entropy decoding procedure may be performed by an entropy decoding processor 316 within the entropy decoder 310. As described above, the bitstream may include various information for image/video decoding such as prediction information in addition to the residual information including the information about the abs_remainder.

It is apparent to those skilled in the art that the procedure of deriving the rice parameter may be omitted for the sig_coeff_flag, the par_level_flag, the rem_abs_gt1_flag, the rem_abs_gt2_flag, and the like which are binarized based on the FL without using the rice parameter. The sig_coeff_flag, the par_level_flag, the rem_abs_gt1_flag, the rem_abs_gt2_flag, and the like may not be binarized based on the rice parameters, but binarized according to the Section 4 (Fixed-length binarization process) of the English specification included in the description of FIG. 3.

As described above, the bitstream may include various information for image/video decoding such as prediction information in addition to the residual information including the information about the abs_remainder. As described above, the bitstream may be delivered to the decoding apparatus through a (digital) storage medium or a network.

The decoding apparatus may derive residual samples for the current block by performing dequantization and/or inverse transformation procedures based on the (quantized) transform coefficients. As described above, reconstruction samples may be generated based on the residual samples and the prediction samples derived through inter/intra prediction, and a reconstructed picture including the reconstruction samples may be generated.

Figure 10:
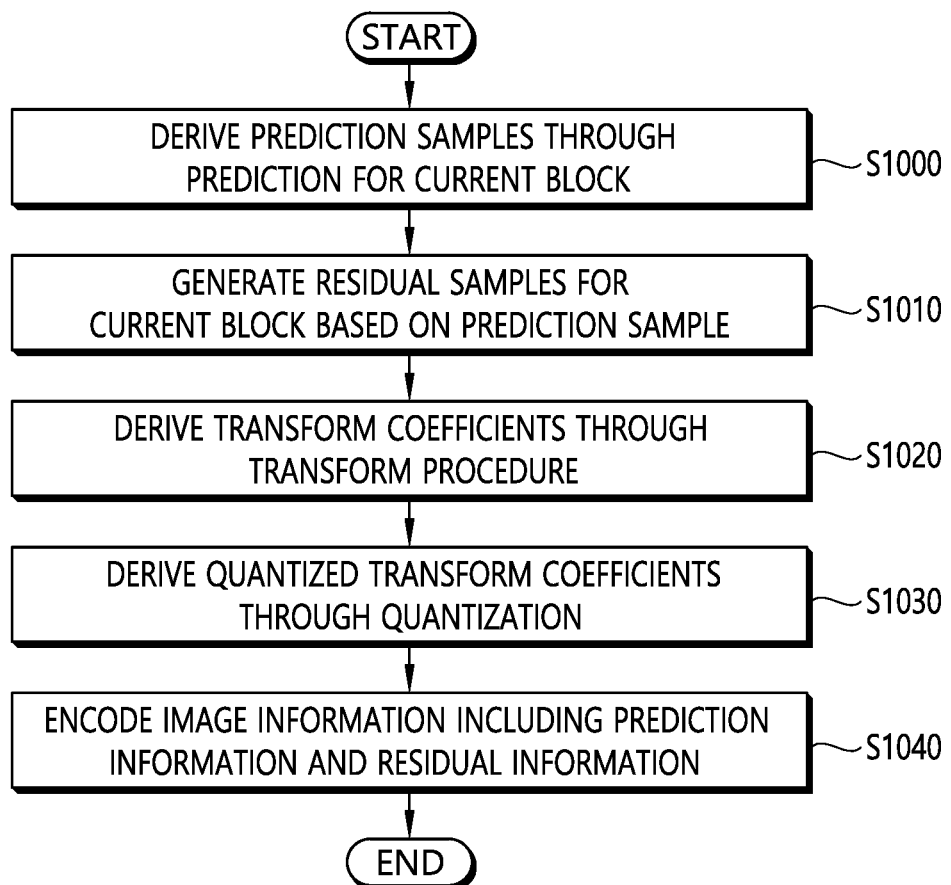
FIG. 10 is a flowchart illustrating an entropy encoding method of an encoding apparatus according to an embodiment.

FIG. 10 is a flowchart illustrating an entropy encoding method of an encoding apparatus according to an embodiment.

S810 and S820 described above with reference to FIG. 8A may be included in S1040 illustrated in FIG. 10.

S1000 may be performed by the inter predictor 221 or the intra predictor 222 of the encoding apparatus, and S1010, S1020, S1030, and S1040 may be performed by the subtractor 231, the transformer 232, the quantizer 233, and the entropy encoder 240 of the encoding apparatus, respectively.

The encoding apparatus according to an embodiment may derive prediction samples through prediction for a current block (S1000). The encoding apparatus may determine whether to perform inter prediction or intra prediction on the current block, and determine a specific inter prediction mode or a specific intra prediction mode based on a RD cost. According to the determined mode, the encoding apparatus may derive the prediction samples for the current block.

The encoding apparatus according to an embodiment may derive residual samples by comparing the original samples with the prediction samples for the current block (S1010).

The encoding apparatus according to an embodiment may derive transform coefficients through a transform procedure for the residual samples (S1020) and derive quantized transform coefficients by quantizing the derived transform coefficients (S1030).

The encoding apparatus according to an embodiment may encode image information including prediction information and residual information, and output the encoded image information in the form of a bitstream (S1040). The prediction information is information related to the prediction procedure, and may include prediction mode information, information about motion information (for example, a case where the inter prediction is applied), and the like. The residual information is information about the quantized transform coefficients, and may include, for example, information disclosed in Table 1 above.

The output bitstream may be delivered to the decoding apparatus through a storage medium or a network.

Figure 11:
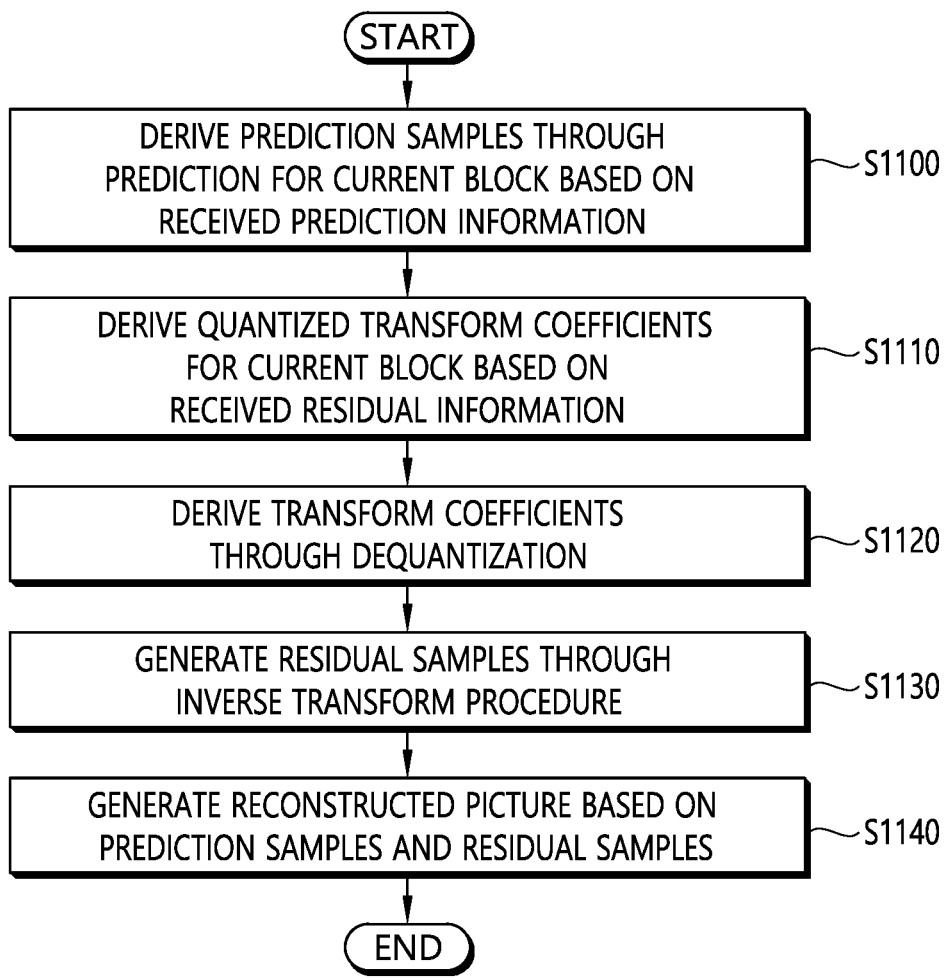
FIG. 11 is a flowchart illustrating an entropy decoding method of a decoding apparatus according to an embodiment.

FIG. 11 is a flowchart illustrating an entropy decoding method of a decoding apparatus according to an embodiment.

S910 to S920 described above in FIG. 9 may be included in S1110 illustrated in FIG. 11.

S1100 may be performed by the inter predictor 260 or the intra predictor 265 of the decoding apparatus. In S1100, a procedure of decoding the prediction information included in the bitstream and deriving the values of the related syntax elements may be performed by the entropy decoder 310 of the decoding apparatus. S1110, S1120, S1130, and S1140 may be performed by the entropy decoder 210, the dequantizer 220, the inverse transformer 230, and the adder 235 of the decoding apparatus, respectively.

The decoding apparatus according to an embodiment may perform an operation corresponding to an operation which is performed in the encoding apparatus. The decoding apparatus may perform inter prediction or intra prediction on the current block based on the received prediction information and derive prediction samples (S1100).

The decoding apparatus according to an embodiment may derive quantized transform coefficients for the current block based on the received residual information (S1110).

The decoding apparatus according to an embodiment may dequantize the quantized transform coefficients to derive transform coefficients (S1120).

The decoding apparatus according to an embodiment may derive residual samples through an inverse transform procedure on the transform coefficients (S1130).

The decoding apparatus according to an embodiment may generate reconstruction samples for the current block based on the prediction samples and the residual samples, and generate a reconstructed picture based on the reconstruction samples (S1340). As described above, thereafter, an in-loop filtering procedure may be further applied to the reconstructed picture.

Figure 12:
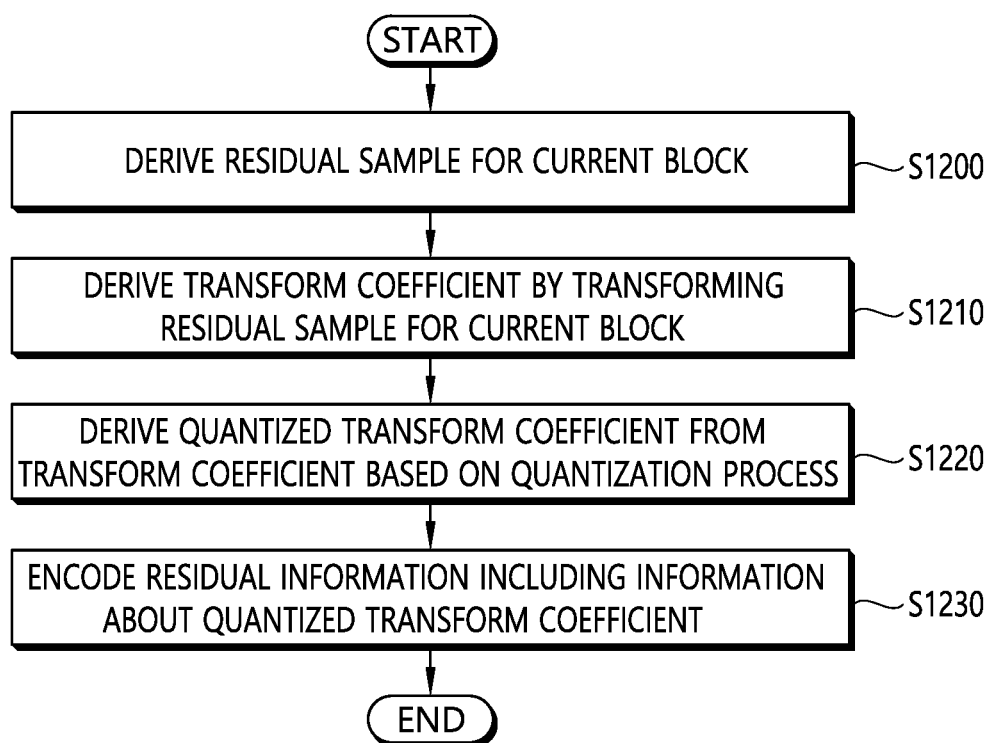
FIG. 12 is a flowchart illustrating an operation of the encoding apparatus according to an embodiment.
Figure 13:
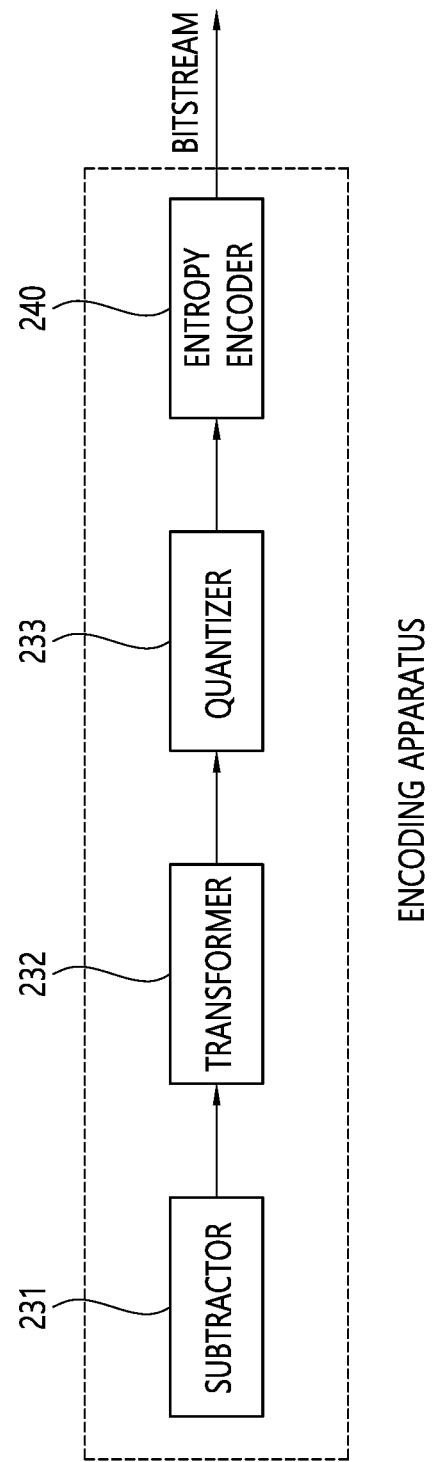
FIG. 13 is a block diagram illustrating a configuration of the encoding apparatus according to an embodiment.

FIG. 12 is a flowchart illustrating an operation of the encoding apparatus according to an embodiment, and FIG. 13 is a block diagram illustrating a configuration of the encoding apparatus according to an embodiment.

Figure 14:
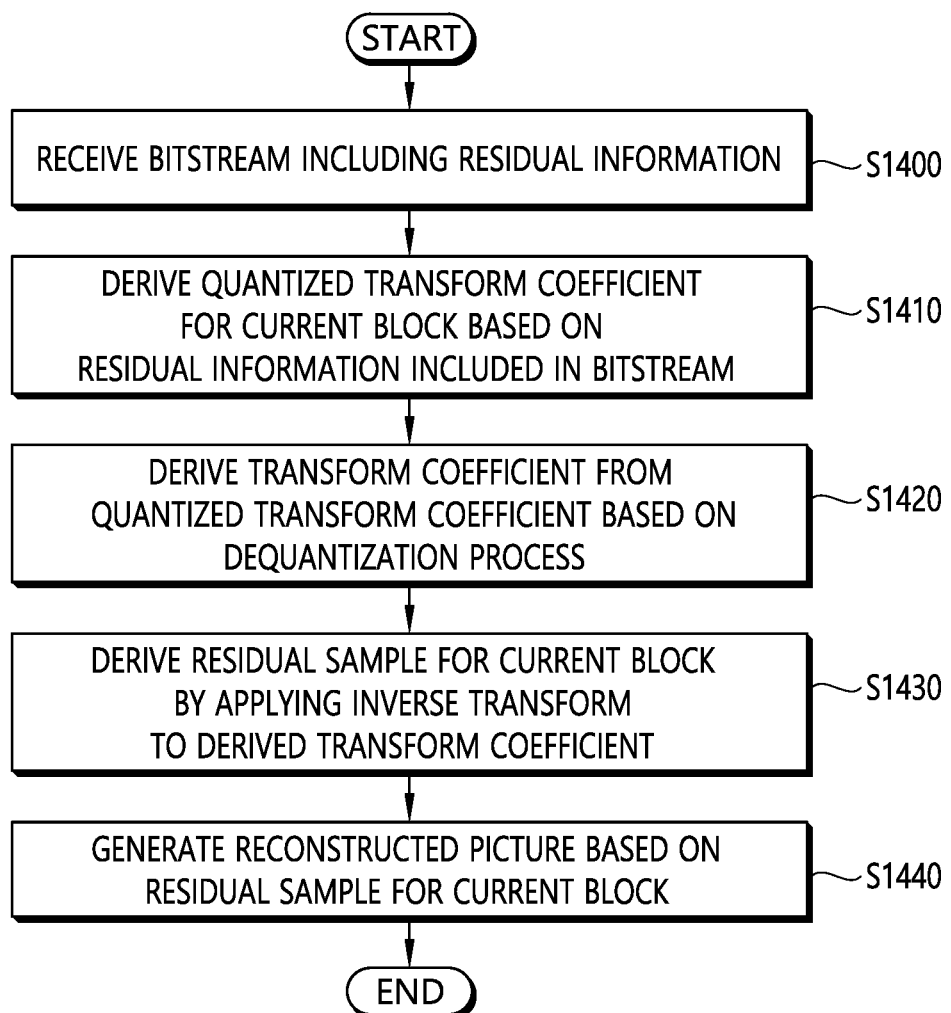
FIG. 14 is a flowchart illustrating an operation of the decoding apparatus according to an embodiment.
Figure 15:
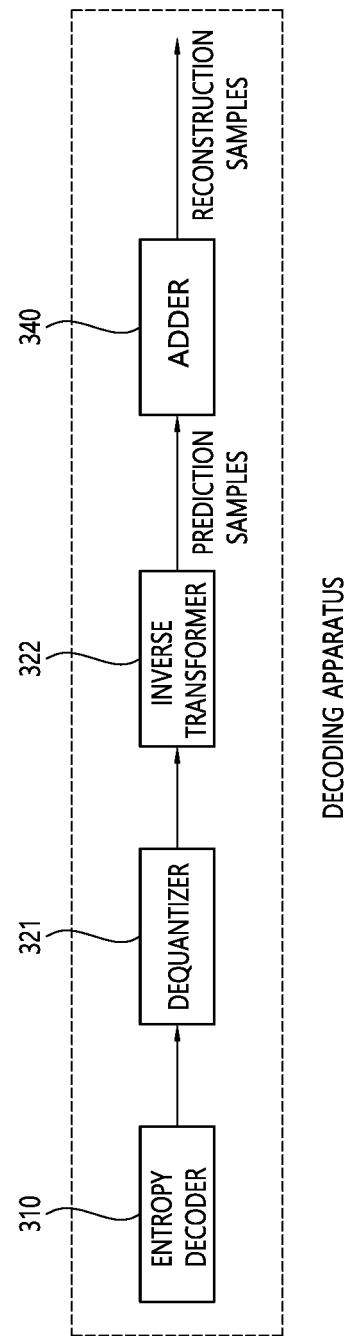
FIG. 15 is a block diagram illustrating a configuration of the decoding apparatus according to an embodiment.

The encoding apparatus according to FIGS. 12 and 13 may perform operations corresponding to the decoding apparatus according to FIGS. 14 and 15. Accordingly, the operations of the decoding apparatus to be described later in FIGS. 14 and 15 may also be applied to the encoding apparatus according to FIGS. 12 and 13.

Each step illustrated in FIG. 12 may be performed by the encoding apparatus 200 illustrated in FIG. 2. More specifically, S1200 may be performed by the subtractor 231 illustrated in FIG. 2, S1210 may be performed by the transformer 232 illustrated in FIG. 2, S1220 may be performed by the quantizer 233 illustrated in FIGS. 2, and S1230 may be performed by the entropy encoder 240 illustrated in FIG. 2. Further, the operations according to S1200 to S1230 are based on some of the aforementioned descriptions with reference to FIGS. 4 to 11. Accordingly, detailed descriptions which overlap with the aforementioned descriptions with reference to FIGS. 2 and 4 to 11 will be omitted or simplified.

As illustrated in FIG. 13, the encoding apparatus according to an embodiment may include the subtractor 231, the transformer 232, the quantizer 233, and the entropy encoder 240. However, in some cases, all of the components illustrated in FIG. 13 may not be essential components of the encoding apparatus, and the encoding apparatus may be implemented by more or fewer components than the components illustrated in FIG. 13.

In the encoding apparatus according to an embodiment, the subtractor 231, the transformer 232, the quantizer 233, and the entropy encoder 240 may also be implemented as separate chips, respectively, or at least two components may also be implemented through a single chip.

The encoding apparatus according to an embodiment may derive a residual sample for the current block (S1200). More specifically, the subtractor 231 of the encoding apparatus may derive the residual sample for the current block.

The encoding apparatus according to an embodiment may derive the transform coefficient by transforming the residual sample for the current block (S1210). More specifically, the transformer 232 of the encoding apparatus may derive the transform coefficient by transforming the residual sample for the current block.

The encoding apparatus according to an embodiment may derive a quantized transform coefficient from the transform coefficient based on a quantization process (S1220). More specifically, the quantizer 233 of the encoding apparatus may derive the quantized transform coefficient from the transform coefficient based on the quantization process.

The encoding apparatus according to an embodiment may encode residual information including information about the quantized transform coefficient (S1230). More specifically, the entropy encoder 240 of the encoding apparatus may encode the residual information including the information about the quantized transform coefficient.

In an embodiment, the residual information includes transform coefficient level information, and the encoding of the residual information may include deriving a binarization value of the transform coefficient level information by performing a binarization process for the transform coefficient level information based on a rice parameter and encoding the binarization value of the transform coefficient level information. In an example, the rice parameter may be represented as cRiceParam.

In an embodiment, the maximum value of the rice parameter may be 3. In an example, the maximum value of the cRiceParam may be 3.

In an embodiment, an initialization process may be performed to derive at least one rice parameter for the current sub-block included in the current block.

In an embodiment, the rice parameter for the current transform coefficient within the current sub-block is derived based on the last rice parameter for the transform coefficient in the previous order of the current transform coefficient, and if the current transform coefficient is the first transform coefficient of the current sub-block, the value of the last rice parameter for the transform coefficient of the previous order may be zero. In an example, the last rice parameter may be represented as lastRiceParam. In an example, the size of the current sub-block may be 2×2 or 4×4.

In an embodiment, the rice parameter for the current transform coefficient may be derived based on the neighboring reference transform coefficients of the current transform coefficient, and the number of neighboring reference transform coefficients may be 4 or less.

In an embodiment, a temporary sum coefficient may be derived based on the neighboring reference transform coefficients, a value of the rice parameter may be determined as zero when a value of the temporary sum coefficient is less than a first threshold, the value of the rice parameter may be determined as 1 if the value of the temporary sum coefficient is the first threshold or more and smaller than a second threshold, the value of the rice parameter may be determined as 2 if the value of the temporary sum coefficient is the second threshold or more and smaller than a third threshold, and the value of the rice parameter may be determined as 3 if the value of the temporary sum coefficient is the third threshold or more. In an example, the temporary sum coefficient may be represented as locSumAbs.

In an embodiment, the first threshold may be 1, 2 or 3, the second threshold may be 4, 5 or 6, and the third threshold may be 10, 11 or 12. In an example, the first threshold may be represented as $th_1$, the second threshold may be represented as $th_2$, and the third threshold may be represented as $th_3$.

According to the encoding apparatus and an operation method of the encoding apparatus illustrated in FIGS. 12 and 13, it is characterized that the encoding apparatus derives a residual sample for a current block (S1200), derives a transform coefficient by transforming the residual sample for the current block (S1210), derives a quantized transform coefficient from the transform coefficient based on a quantization process (S1220), and encodes residual information including information about the quantized transform coefficient (S1230), the residual information includes transform coefficient level information, and the encoding of the residual information includes deriving a binarization value of the transform coefficient level information by performing a binarization process for the transform coefficient level information based on a rice parameter and encoding the binarization value of the transform coefficient level information, and the maximum value of the rice parameter is 3. That is, residual coding may be efficiently performed by setting the maximum value of the rice parameter as 3.

FIG. 14 is a flowchart illustrating an operation of the decoding apparatus according to an embodiment, and FIG. 15 is a block diagram illustrating a configuration of the decoding apparatus according to an embodiment.

Each step illustrated in FIG. 14 may be performed by the decoding apparatus 300 illustrated in FIG. 3. More specifically, S1400 and S1410 may be performed by the entropy decoder 310 illustrated in FIG. 3, S1420 may be performed by the dequantizer 321 illustrated in FIG. 3, S1430 may be performed by the inverse transformer 322, and S1440 may be performed by the adder 340. Further, the operations according to S1400 to S1440 are based on some of the aforementioned descriptions with reference to FIGS. 4 to 11. Accordingly, detailed descriptions which overlap with the aforementioned descriptions in FIGS. 3 to 11 will be omitted or simplified.

As illustrated in FIG. 15, the decoding apparatus according to an embodiment may include the entropy decoder 310, the dequantizer 321, the inverse transformer 322, and the adder 340. However, in some cases, all of the components illustrated in FIG. 15 may not be essential components of the decoding apparatus, and the decoding apparatus may be implemented by more or fewer components than the components illustrated in FIG. 15.

In the decoding apparatus according to an embodiment, the entropy decoder 310, the dequantizer 321, the inverse transformer 322, and the adder 340 are each implemented as separate chips, or at least two components may also be implemented through a single chip.

The decoding apparatus according to an embodiment may receive a bitstream including residual information (S1400). More specifically, the entropy decoder 310 of the decoding apparatus may receive the bitstream including the residual information.

The decoding apparatus according to an embodiment may derive a quantized transform coefficient for the current block based on the residual information included in the bitstream (S1410). More specifically, the entropy decoder 310 of the decoding apparatus may derive the quantized transform coefficient for the current block based on the residual information included in the bitstream.

The decoding apparatus according to an embodiment may derive a transform coefficient from the quantized transform coefficient based on a dequantization process (S1420). More specifically, the dequantizer 321 of the decoding apparatus may derive the transform coefficient from the quantized transform coefficient based on the dequantization process.

The decoding apparatus according to an embodiment may derive a residual sample for the current block by applying an inverse transform to the derived transform coefficient (S1430). More specifically, the inverse transformer 322 of the decoding apparatus may derive the residual sample for the current block by applying the inverse transform to the derived transform coefficient.

The decoding apparatus according to an embodiment may generate a reconstructed picture based on the residual sample for the current block (S1440). More specifically, the adder 340 of the decoding apparatus may generate the reconstructed picture based on the residual sample for the current block.

In an embodiment, the residual information includes transform coefficient level information, and the deriving of the quantized transform coefficient may include performing a binarization process for the transform coefficient level information based on a rice parameter, deriving a value of the transform coefficient level information based on the result of the binarization process, and deriving the quantized transform coefficient based on the value of the transform coefficient level information. In an example, the rice parameter may be represented as cRiceParam.

In an embodiment, the maximum value of the rice parameter may be 3. In an example, the maximum value of the cRiceParam may be 3.

In an embodiment, an initialization process may be performed to derive at least one rice parameter for the current sub-block included in the current block.

In an embodiment, the rice parameter for the current transform coefficient within the current sub-block may be derived based on the last rice parameter for the transform coefficient in the previous order of the current transform coefficient, and a value of the last rice parameter for the transform coefficient of the previous order may be zero if the current transform coefficient is the first transform coefficient of the current sub-block. In an example, the last rice parameter may be represented as lastRiceParam. In an example, the size of the current sub-block may be 2×2 or 4×4.

In an embodiment, the rice parameter for the current transform coefficient may be derived based on the neighboring reference transform coefficients of the current transform coefficient, and the number of neighboring reference transform coefficients may be 4 or less.

In an embodiment, a temporary sum coefficient may be derived based on the neighboring reference transform coefficients, a value of the rice parameter may be determined as zero if the value of the temporary sum coefficient is smaller than a first threshold (for example, $th_1$), the value of the rice parameter may be determined as 1 if the value of the temporary sum coefficient is the first threshold or more and smaller than a second threshold (for example, $th_2$), the value of the rice parameter may be determined as 2 if the value of the temporary sum coefficient is the second threshold or more and smaller than a third threshold (for example, $th_3$), and the value of the rice parameter may be determined as 3 if the value of the temporary sum coefficient is the third threshold or more. In an example, the temporary sum coefficient may be represented as locSumAbs.

In an embodiment, the first threshold may be 1, 2 or 3, the second threshold may be 4, 5 or 6, and the third threshold may be 10, 11 or 12. In an example, the first threshold may be represented as $th_1$, the second threshold may be represented as $th_2$, and the third threshold may be represented as $th_3$.

According to the decoding apparatus and an operating method of the decoding apparatus illustrated in FIGS. 14 and 15, it is characterized that the decoding apparatus receives a bitstream including residual information (S1400), derives a quantized transform coefficient for the current block based on the residual information included in the bitstream (S1410), derives a transform coefficient from the quantized transform coefficient based on a dequantization process (S1420), and derives a residual sample for the current block by applying an inverse transform to the derived transform coefficient (S1430), and generates a reconstructed picture based on the residual sample for the current block (S1440), and the residual information includes transform coefficient level information, the deriving of the quantized transform coefficient includes performing a binarization process for the transform coefficient level information based on a rice parameter, deriving a value of the transform coefficient level information based on the result of the binarization process, and deriving the quantized transform coefficient based on the value of the transform coefficient level information, and the maximum value of the rice parameter is 3. That is, residual coding may be efficiently performed by setting the maximum value of the rice parameter as 3.

In the aforementioned embodiments, while the methods are described based on the flowcharts as a series of steps or blocks, the present disclosure is not limited to the order of steps, and a certain step may occur in different order from or simultaneously with a step different from that described above. Further, those skilled in the art will understand that the steps shown in the flowchart are not exclusive, and other steps may be included or one or more steps in the flowcharts may be deleted without affecting the scope of the present disclosure.

The aforementioned method according to the present disclosure may be implemented in the form of software, and the encoding apparatus and/or the decoding apparatus according to the present disclosure may be included in the apparatus for performing image processing of, for example, a TV, a computer, a smartphone, a set-top box, a display device, and the like.

When the embodiments in the present disclosure are implemented in software, the aforementioned method may be implemented as a module (process, function, and the like) for performing the aforementioned function. The module may be stored in a memory, and executed by a processor. The memory may be located inside or outside the processor, and may be coupled with the processor by various well-known means. The processor may include application-specific integrated circuits (ASICs), other chipsets, logic circuits, and/or data processing devices. The memory may include a read-only memory (ROM), a random access memory (RAM), a flash memory, a memory card, a storage medium and/or other storage devices. That is, the embodiments described in the present disclosure may be performed by being implemented on a processor, a microprocessor, a controller, or a chip. For example, the functional units illustrated in each drawing may be performed by being implemented on the computer, the processor, the microprocessor, the controller, or the chip. In this case, information for implementation (for example, information on instructions) or algorithm may be stored in a digital storage medium.

Further, the decoding apparatus and the encoding apparatus to which the present disclosure is applied may be included in a multimedia broadcast transceiver, a mobile communication terminal, a home cinema video device, a digital cinema video device, a surveillance camera, a video communication device, a real-time communication device such as video communication, a mobile streaming device, a storage medium, a camcorder, a Video on Demand (VoD) service provider, an Over the top video (OTT video) device, an Internet streaming service provider, a three-dimensional (3D) video device, a virtual reality (VR) device, an augmented reality (AR) device, a video telephony video device, a transportation terminal (for example, vehicle (including autonomous vehicle), airplane terminal, ship terminal, or the like), and a medical video device, and the like, and may be used to process video signals or data signals. For example, the Over the top video (OTT video) device may include a game console, a Blu-ray player, an Internet-connected TV, a home theater system, a smartphone, a tablet PC, a Digital Video Recorder (DVR), and the like.

Further, the processing method to which the present disclosure is applied may be produced in the form of a program executed by a computer, and may be stored in a computer readable recording medium. The multimedia data having a data structure according to the present disclosure may also be stored in the computer readable recording medium. The computer readable recording medium includes all kinds of storage devices and distributed storage devices in which computer readable data are stored. The computer readable recording medium may include, for example, a Blu-ray Disc (BD), a Universal Serial Bus (USB), a ROM, a PROM, an EPROM, an EEPROM, a RAM, a CD-ROM, a magnetic tape, a floppy disk, and an optical data storage device. Further, the computer readable recording medium includes media implemented in the form of a carrier wave (for example, transmission via the Internet). Further, the bitstream generated by the encoding method may be stored in the computer readable recording medium or transmitted through wired/wireless communication networks.

Further, the embodiments of the present disclosure may be implemented as a computer program product by a program code, and the program code may be executed on the computer according to the embodiments of the present disclosure. The program code may be stored on a computer readable carrier.

Figure 16:
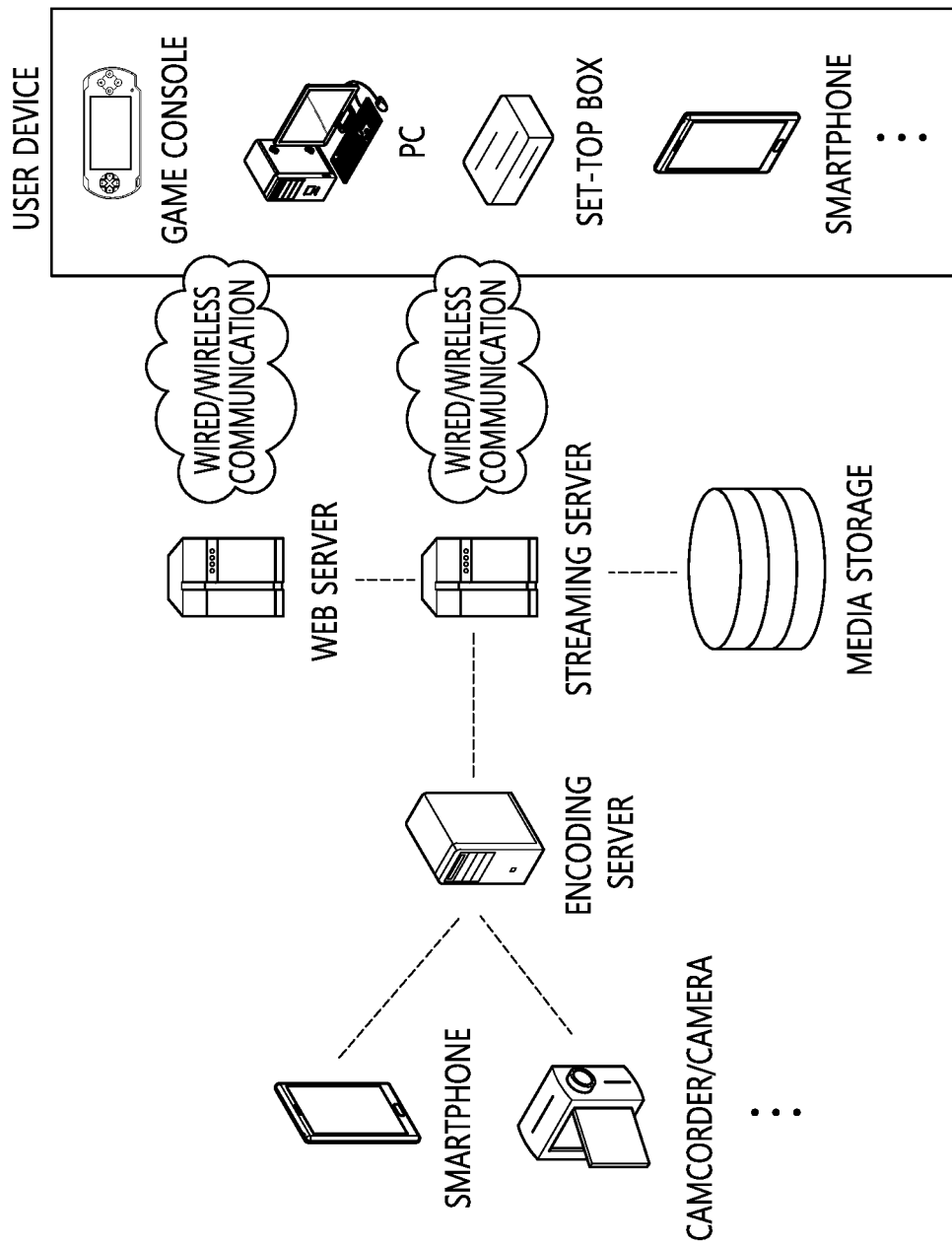
FIG. 16 is a diagram illustrating an example of a content streaming system to which the disclosure disclosed in the present document may be applied.

FIG. 16 illustrates an example of a content streaming system to which the disclosure disclosed in the present document may be applied.

Referring to FIG. 16, the content streaming system to which the present disclosure is applied may largely include an encoding server, a streaming server, a web server, a media storage, a user device, and a multimedia input device.

The encoding server serves to compact the contents, which are input from multimedia input devices such as a smartphone, a camera, and a camcorder into digital data, to generate the bitstream and to transmit the bitstream to the streaming server. As another example, when the multimedia input devices such as a smartphone, a camera, and a camcorder directly generate the bitstream, the encoding server may be omitted.

The bitstream may be generated by the encoding method or the bitstream generating method to which the present disclosure is applied, and the streaming server may temporarily store the bitstream in the process of transmitting or receiving the bitstream.

The streaming server serves as a medium of transmitting multimedia data to a user device based on a user request through a web server, and the web server serves as a medium of informing the user of which services are available. If the user requests a desired service from the web server, the web server delivers the request to the streaming server, and the streaming server transmits multimedia data to the user. At this time, the content streaming system may include a separate control server, and in this case, the control server performs the role of controlling commands/responses between devices within the content streaming system.

The streaming server may receive contents from a media storage and/or an encoding server. For example, if contents are received from the encoding server, the contents may be received in real-time. In this case, to provide a smooth streaming service, the streaming server may store the bitstream for a certain time.

Examples of the user device may include a mobile phone, a smartphone, a laptop computer, a digital broadcast terminal, a personal digital assistant (PDA), a portable multimedia player (PMP), a navigation terminal, a slate PC, a tablet PC, an ultrabook, a wearable device (for example, smart watch, smart glass, or head mounted display (HMD)), a digital TV, a desktop computer, a digital signage, and the like.

Each server within the content streaming system may be operated as a distributed server, and in this case, data received by each server may be processed in a distributed manner.

What is claimed is:

1. An image decoding method performed by a decoding apparatus, the method comprising:
obtaining residual information from a bitstream;
deriving a quantized transform coefficient for a current block based on the residual information;
deriving a transform coefficient based on the quantized transform coefficient;
deriving a residual sample for the current block based on the transform coefficient; and
generating a reconstructed picture based on the residual sample for the current block,
wherein the residual information includes a significant coefficient flag representing whether a quantized transform coefficient is a non-zero significant coefficient, a parity level flag for a parity of a transform coefficient level for the quantized transform coefficient, a first transform coefficient level flag about whether the transform coefficient level is larger than a first reference value, a second transform coefficient level flag about whether the transform coefficient level is larger than a second reference value and remainder information of the transform coefficient level,
wherein deriving the quantized transform coefficients comprises:
deriving the quantized transform coefficient based on decoding the parity level flag and decoding the first transform coefficient level flag, and
wherein the decoding of the first transform coefficient level flag is performed prior to the decoding of the parity level flag.

2. The method of claim 1, wherein the sum of the number of significant coefficient flags for the quantized transform coefficients within the current block, the number of parity level flags, the number of first transform coefficient level flags and the number of second transform coefficient level flags, which are comprised in the residual information, is a predetermined threshold or less.

3. The method of claim 2, wherein the predetermined threshold is determined based on the size of the current block.

4. The method of claim 1, wherein an initialization process is performed to derive at least one rice parameter for a current sub-block comprised in the current block.

5. The method of claim 4, wherein the rice parameter for a current transform coefficient within the current sub-block is derived based on a last rice parameter for a transform coefficient of a previous order of the current transform coefficient, and wherein if the current transform coefficient is the first transform coefficient of the current sub-block, a value of the last rice parameter for the transform coefficient of the previous order is zero.

6. The method of claim 4, wherein the size of the current sub-block is 2×2 or 4×4.

7. The method of claim 5, wherein the rice parameter for the current transform coefficient is derived based on neighboring reference transform coefficients of the current transform coefficient, and the number of neighboring reference transform coefficients is 4 or less.

8. The method of claim 7, wherein a temporary sum coefficient is derived based on the neighboring reference transform coefficients, and
wherein the value of the rice parameter is determined as zero if the value of the temporary sum coefficient is smaller than a first threshold, the value of the rice parameter is determined as 1 if the value of the temporary sum coefficient is the first threshold or more and smaller than a second threshold, the value of the rice parameter is determined as 2 if the value of the temporary sum coefficient is the second threshold or more and smaller than a third threshold, and the value of the rice parameter is determined as 3 if the value of the temporary sum coefficient is the third threshold or more.

9. The method of claim 8, wherein the first threshold is 1, 2, or 3, the second threshold is 4, 5, or 6, and the third threshold is 10, 11, or 12.

10. An image encoding method performed by an encoding apparatus, the method comprising:
deriving a residual sample for a current block;
deriving a transform coefficient for the current block based on the residual sample;
deriving a quantized transform coefficient based on the transform coefficient; and
encoding residual information comprising information related to the quantized transform coefficient,
wherein the residual information includes a significant coefficient flag representing whether a quantized transform coefficient is a non-zero significant coefficient, a parity level flag for a parity of a transform coefficient level for the quantized transform coefficient, a first transform coefficient level flag about whether the transform coefficient level is larger than a first reference value, a second transform coefficient level flag about whether the transform coefficient level is larger than a second reference value and remainder information of the transform coefficient level,
wherein the encoding of the residual information comprises:
encoding the parity level flag and encoding the first transform coefficient level flag, and
wherein the encoding of the first transform coefficient level flag is performed prior to the encoding of the parity level flag.

11. A transmission method of data for an image, the method comprising:
obtaining a bitstream for the image, wherein the bitstream is generated based on deriving a residual sample for a current block, deriving a transform coefficient for the current block based on the residual sample, deriving a quantized transform coefficients based on the transform coefficient, and encoding residual information compris ing information related to the quantized transform coefficient; and transmitting the data comprising the bitstream, wherein the residual information includes a significant coefficient flag representing whether a quantized transform coefficient is a non-zero significant coefficient, a parity level flag for a parity of a transform coefficient level for the quantized transform coefficient, a first transform coefficient level flag about whether the transform coefficient level is larger than a first reference value, a second transform coefficient level flag about whether the transform coefficient level is larger than a second reference value and remainder information of the transform coefficient level, wherein the encoding of the residual information comprises:

encoding the parity level flag and encoding the first transform coefficient level flag, and wherein the encoding of the first transform coefficient level flag is performed prior to the encoding of the parity level flag.

\* \* \* \* \*